US012588289B2

(12) United States Patent
Yang et al.

(10) Patent No.: US 12,588,289 B2
(45) Date of Patent: Mar. 24, 2026

(54) ELECTRONIC DEVICE

(71) Applicant: InnoLux Corporation, Miao-Li County (TW)

(72) Inventors: Cheng-Yu Yang, Miao-Li County (TW); Chih-Hao Chang, Miao-Li County (TW); Chia-Hao Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 375 days.

(21) Appl. No.: 18/208,315

(22) Filed: Jun. 12, 2023

(65) Prior Publication Data

US 2024/0021623 A1 Jan. 18, 2024

Related U.S. Application Data

(60) Provisional application No. 63/389,372, filed on Jul. 15, 2022.

(30) Foreign Application Priority Data

Apr. 11, 2023 (CN) .......................... 202310380013.5

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/423* (2025.01); *H10D 86/471* (2025.01)

(58) Field of Classification Search
CPC ...... H10D 86/60; H10D 86/423; H10D 86/40; H10D 86/471; H10D 86/451; H10D 86/421; H10D 30/6723; H10D 30/67; H10D 30/6755; H10D 30/6744
See application file for complete search history.

(56) References Cited

U.S. PATENT DOCUMENTS

| | | | | |
|---|---|---|---|---|
| 10,978,538 | B2 * | 4/2021 | Wang | .................... H10K 59/131 |
| 11,367,815 | B2 * | 6/2022 | Han | ...................... H10D 86/423 |
| 2020/0083309 | A1 * | 3/2020 | Wang | .................... H10D 86/60 |
| 2021/0066555 | A1 * | 3/2021 | Han | ...................... H10D 86/451 |
| 2021/0288078 | A1 | 9/2021 | Suzumura | |
| 2024/0387488 | A1 * | 11/2024 | Wang | .................... H10H 29/142 |

FOREIGN PATENT DOCUMENTS

| | | |
|---|---|---|
| CN | 107039533 | 8/2017 |
| TW | 201707216 | 2/2017 |
| TW | 202114216 | 4/2021 |
| WO | 2021171714 A1 | 9/2021 |

* cited by examiner

*Primary Examiner* — Nikolay K Yushin
(74) *Attorney, Agent, or Firm* — Winston Hsu

(57) ABSTRACT

An electronic device is provided by the present disclosure. The electronic device includes a substrate; a first transistor disposed on the substrate and including a first semiconductor layer and a gate electrode; a first insulating layer disposed between the first semiconductor layer and the gate electrode; a second insulating layer disposed on the first insulating layer, wherein the first semiconductor layer and the gate electrode are located between the substrate and the second insulating layer; a barrier layer disposed on the second insulating layer; and a second transistor disposed on the barrier layer and including a second semiconductor layer, wherein the barrier layer is disposed between the second semiconductor layer and the second insulating layer.

17 Claims, 14 Drawing Sheets

ELECTRONIC DEVICE

CROSS REFERENCE TO RELATED APPLICATION

This application claims the benefit of U.S. Provisional Application No. 63/389,372, filed on Jul. 15, 2022. The content of the application is incorporated herein by reference.

BACKGROUND OF THE DISCLOSURE

1. Field of the Disclosure

The present disclosure relates to an electronic device, and more particularly relates to an electronic device including low temperature polycrystalline oxide (LTPO) technology.

2. Description of the Prior Art

In processes of current low temperature polycrystalline oxide (LTPO) technology, low temperature polycrystalline silicon (LTPS) elements would be formed at first, and then metal oxide semiconductor elements (such as indium gallium zinc oxide (IGZO)) would be formed.

However, when forming the metal oxide semiconductor elements, excessive hydrogen ions may diffuse into the metal oxide semiconductor elements, thereby affecting the characteristics of the metal oxide semiconductor elements. Therefore, to improve the performance of metal oxide semiconductor elements is still an important issue in the present field.

SUMMARY OF THE DISCLOSURE

In some embodiments, the present disclosure provides an electronic device including a substrate; a first transistor disposed on the substrate and including a first semiconductor layer and a gate electrode; a first insulating layer disposed between the first semiconductor layer and the gate electrode; a second insulating layer disposed on the first insulating layer, wherein the first semiconductor layer and the gate electrode are located between the substrate and the second insulating layer; a barrier layer disposed on the second insulating layer; and a second transistor disposed on the barrier layer and including a second semiconductor layer, wherein the barrier layer is disposed between the second semiconductor layer and the second insulating layer.

In some embodiments, the present disclosure provides an electronic device having a display area and a non-display area. The electronic device includes a substrate; a first transistor disposed on the substrate, wherein the first transistor is disposed in the non-display area; a second transistor disposed on the substrate, wherein the second transistor is disposed in the display area; and an organic layer disposed on the first transistor and the second transistor, wherein the organic layer includes a first portion and a second portion, the first portion is disposed corresponding to the first transistor, and the second portion is disposed corresponding to the second transistor. A first distance is a minimum distance from the substrate to the first portion, a second distance is a minimum distance from the substrate to the second portion, and the first distance is greater than the second distance.

These and other objectives of the present disclosure will no doubt become obvious to those of ordinary skill in the art after reading the following detailed description of the embodiment that is illustrated in the various figures and drawings.

DETAILED DESCRIPTION

Figure 1:
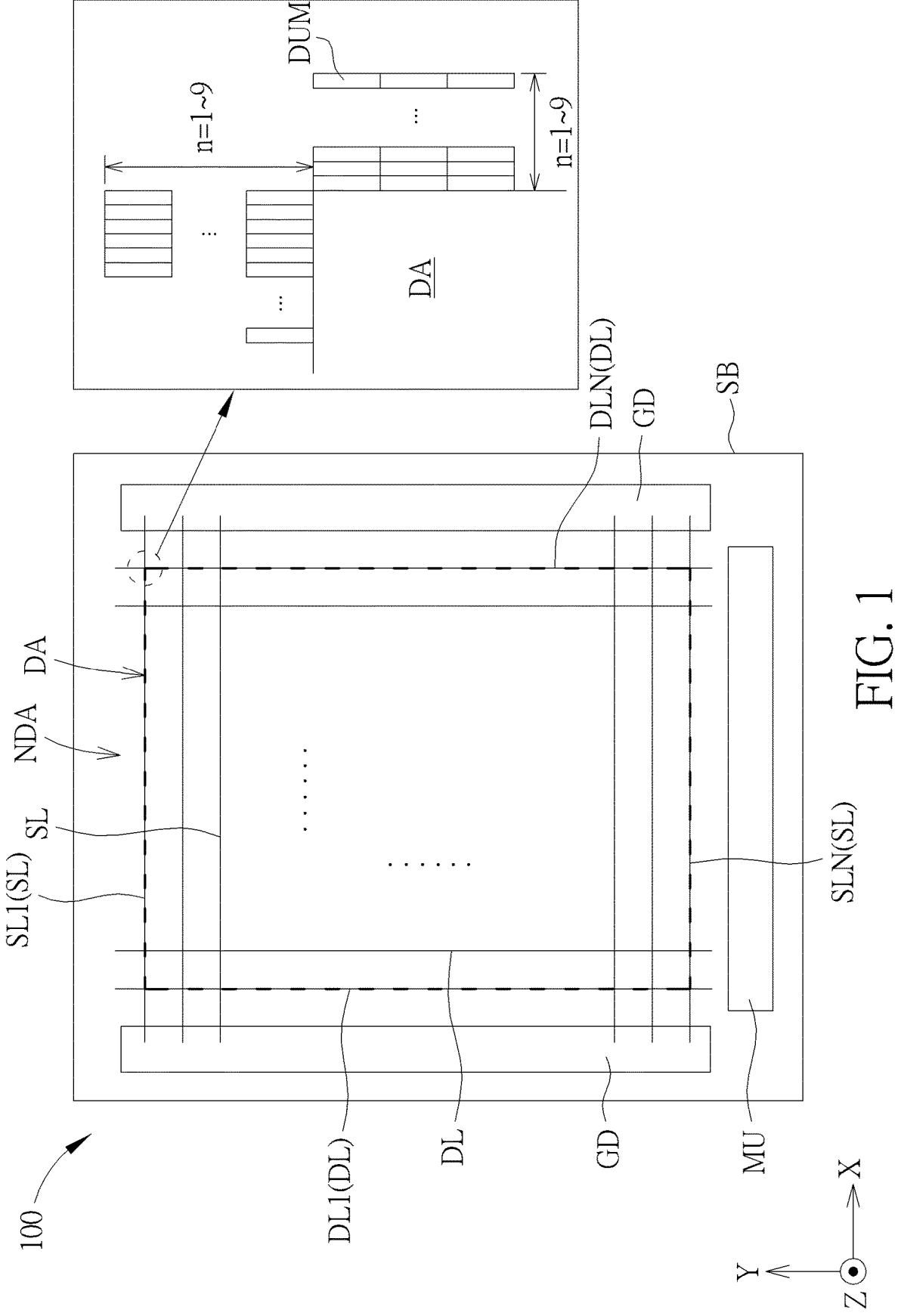
FIG. 1 schematically illustrates a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection. The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

According to the present disclosure, the thickness, length and width may be measured through optical microscope, and the thickness or width may be measured through the cross-sectional view in the electron microscope, but not limited thereto.

In addition, any two values or directions used for comparison may have certain errors. In addition, the terms "equal to", "equal", "the same", "approximately" or "substantially" are generally interpreted as being within ±20%, ±10%, ±5%, ±3%, ±2%, ±1%, or ±0.5% of the given value.

In addition, the terms "the given range is from a first value to a second value" or "the given range is located between a first value and a second value" represents that the given range includes the first value, the second value and other values there between.

If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

It should be noted that the technical features in different embodiments described in the following can be replaced, recombined, or mixed with one another to constitute another embodiment without departing from the spirit of the present disclosure.

The electronic device of the present disclosure may include a display device, a sensing device, a back-light device, an antenna device, a tiled device or other suitable electronic devices, but not limited thereto. The electronic device may be a foldable electronic device, a flexible electronic device or a stretchable electronic device. The display device may for example be applied to laptops, common displays, tiled displays, vehicle displays, touch displays, televisions, monitors, smart phones, tablets, light source modules, lighting devices or electronic devices applied to the products mentioned above, but not limited thereto. The sensing device may for example include a biosensor, a touch sensor, a fingerprint sensor, other suitable sensors or combinations of the above-mentioned sensors. The antenna device may for example include a liquid crystal antenna device or a non-liquid crystal antenna device, but not limited thereto. The tiled device may for example include a tiled display device or a tiled antenna device, but not limited thereto. The outline of the electronic device may be a rectangle, a circle, a polygon, a shape with curved edge or other suitable shapes. The electronic device may include electronic elements, wherein the electronic elements may include passive elements or active elements, such as capacitor, resistor, inductor, diode, transistor, sensors, and the like. The diode may include a light emitting diode or a photo diode. The light emitting diode may for example include an organic light emitting diode (OLED) or an in-organic light emitting diode. The in-organic light emitting diode may for example include a mini light emitting diode (mini LED), a micro light emitting diode (micro LED) or a quantum dot light emitting diode (QLED), but not limited thereto. It should be noted that the electronic device of the present disclosure may be combinations of the above-mentioned devices, but not limited thereto. It should be noted that the electronic device may be arrangements of the above-mentioned devices, but the present disclosure is not limited thereto. In addition, the outline of the electronic device may be a rectangle, a circle, a polygon, a shape with curved edge or other suitable shapes. The electronic device may include peripheral systems such as driving systems, controlling systems, light source systems to support display devices, antenna devices, wearable devices (such as augmented reality devices or virtual reality devices), vehicle devices (such as windshield of car) or tiled devices.

Figure 2:
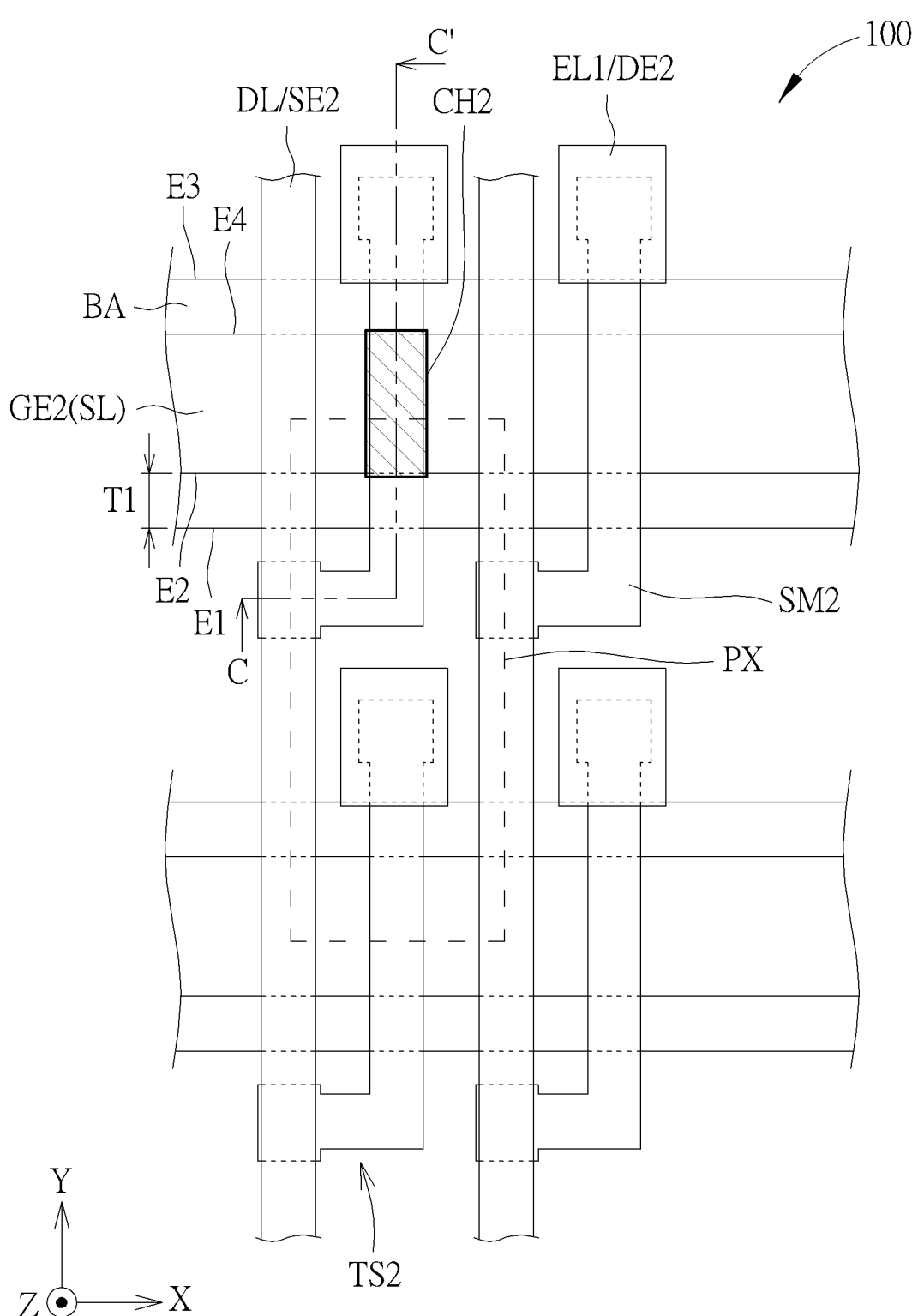
FIG. 2 schematically illustrates a partial enlarged top view of the electronic device according to the first embodiment of the present disclosure.
Figure 3:
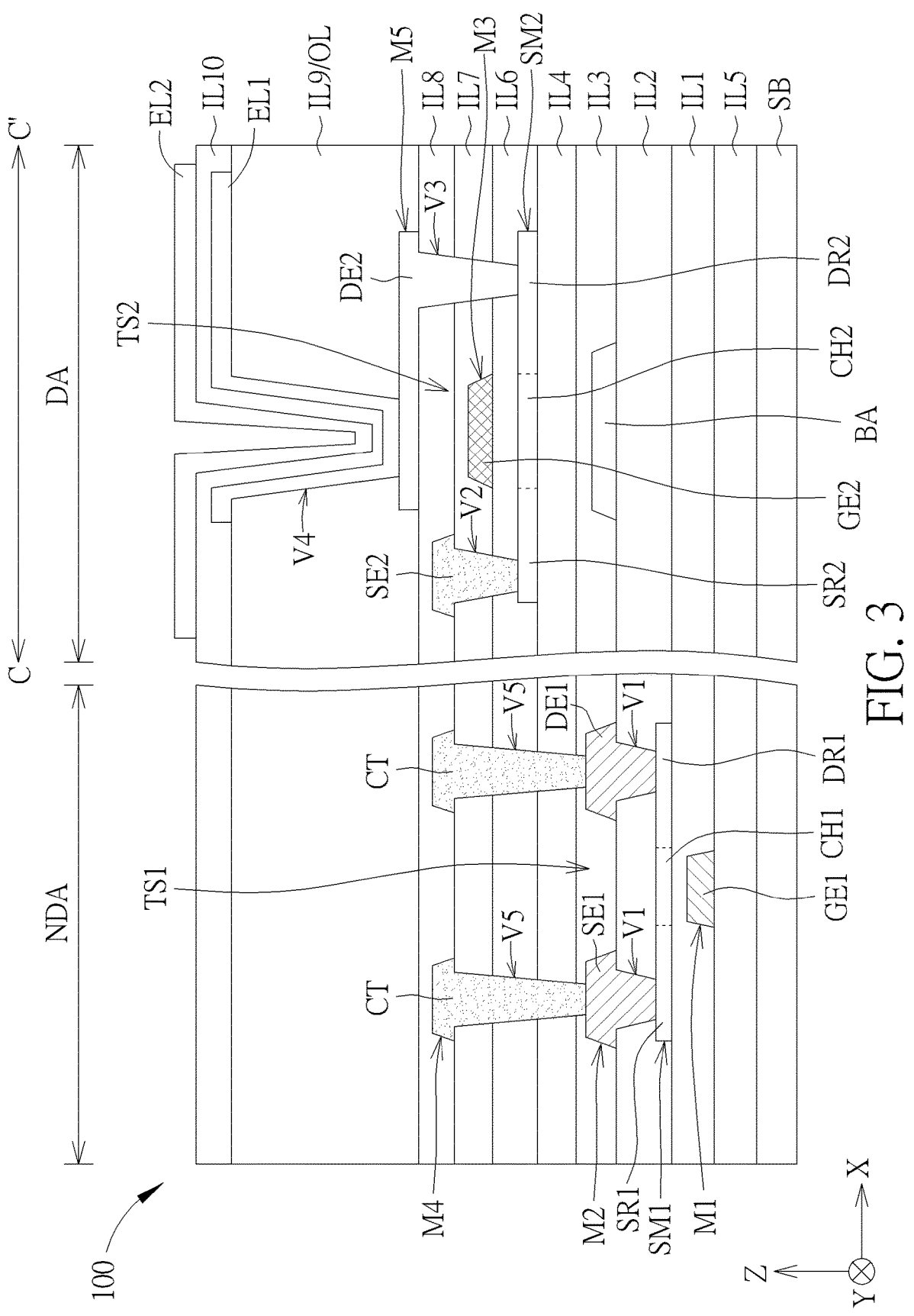
FIG. 3 schematically illustrates a cross sectional view of the electronic device according to the first embodiment of the present disclosure.

Referring to FIG. 1 to FIG. 3, FIG. 1 schematically illustrates a top view of an electronic device according to a first embodiment of the present disclosure, FIG. 2 schematically illustrates a partial enlarged top view of the electronic device according to the first embodiment of the present disclosure, and FIG. 3 schematically illustrates a cross sectional view of the electronic device according to the first embodiment of the present disclosure. According to the present embodiment, the electronic device 100 includes a substrate SB, a first transistor TS1 disposed on the substrate SB and a second transistor TS2 disposed on the substrate SB. The substrate SB may include a rigid substrate or a flexible substrate. The material of the substrate SB for example includes glass, quartz, sapphire, ceramic, polyimide (PI), polycarbonate (PC), polyethylene terephthalate (PET), other suitable materials or combinations of the above-mentioned materials, but not limited thereto. The first transistor TS1 may include a first semiconductor layer SM1, a gate electrode GE1, a source electrode SE1 and a drain electrode DE1. The first semiconductor layer SM1 may include a source region SR1, a drain region DR1 and a channel region CH1 located between the source region SR1 and the drain region DR1, wherein the source electrode SE1 is electrically connected to the source region SR1, and the drain electrode DE1 is electrically connected to the drain region DR1. The channel region CH1 is a region of the first semiconductor layer SM1 of the first transistor TS1 which is not doped, and the channel region CH1 may substantially be disposed corresponding to the gate electrode GE1. In other words, in a top view direction (that is, parallel to the direction Z) of the electronic device 100, the region in the first semiconductor layer SM1 overlapped with the gate electrode GE1 may be defined as the channel region CH1. The second transistor TS2 may include a second semiconductor layer SM2, a gate electrode GE2, a source electrode SE2, and a drain electrode DE2. The second semiconductor layer SM2 may include a source region SR2, a drain region DR2 and a channel region CH2 located between the source region SR2 and the drain region DR2, wherein the source electrode SE2 is electrically connected to the source region SR2, and the drain electrode DE2 is electrically connected to the drain region DR2. The channel region CH2 is a region of the second semiconductor layer SM2 of the second transistor TS2 which is not doped, and the channel region CH2 may substantially be disposed corresponding to the gate electrode GE2. In other words, in the top view direction of the electronic device 100, the region in the second semiconductor layer SM2 overlapped with the gate electrode GE2 may be defined as the channel region CH2. The structure shown in FIG. 3 is taken as an example to describe the structures and dispositions of the first transistor TS1 and the second transistor TS2 of the electronic device 100 of the present embodiment in the following. It should be noted that the structure shown in FIG. 3 is just exemplary, the structures of the first transistor TS1 and the second transistor TS2 of the present disclosure and dispositions thereof in the electronic device 100 are not limited to what is shown in FIG. 3.

As shown in FIG. 3, the electronic device 100 may include a first conductive layer M1 disposed on the substrate SB, wherein the first conductive layer M1 may form the gate electrode GE1 of the first transistor TS1. The electronic device 100 may include a first insulating layer IL1, wherein the first insulating layer IL1 may be disposed on the substrate SB and cover the first conductive layer M1. The first semiconductor layer SM1 may be disposed on the first insulating layer IL1, that is, the first insulating layer IL1 may be disposed between the first semiconductor layer SM1 and the gate electrode GE1. The first insulating layer IL1 may serve as the gate insulating layer of the first transistor TS1. The electronic device 100 may include a second insulating layer IL2 disposed on the first insulating layer IL1, and the first semiconductor layer SM1 and the gate electrode GE1 are located between the substrate SB and the second insulating layer IL2. The electronic device 100 may include a second conductive layer M2 disposed on the second insulating layer IL2. The second conductive layer M2 may form the source electrode SE1 and the drain electrode DE1 of the first transistor TS1. In detail, the second conductive layer M2 may be filled into a via V1 penetrating the second insulating layer IL2 and respectively contact the source region SR1 and the drain region DR1, thereby forming the source electrode SE1 and the drain electrode DE1. According to the present embodiment, the first semiconductor layer SM1 may include low temperature polycrystalline silicon (LTPS), but not limited thereto. The first insulating layer IL1 and the second insulating layer IL2 may include any suitable insulating materials, such as inorganic insulating materials, but not limited thereto. The first conductive layer M1 and the second conductive layer M2 may include any suitable conductive materials, such as metal materials, but not limited thereto. In the present embodiment, the first transistor TS1 may include a bottom gate transistor, but not limited thereto. In other embodiments, the first transistor TS1 may include a top gate transistor, a dual gate transistor or a transistor of other types.

Moreover, the second semiconductor layer SM2 may be disposed on the second insulating layer IL2. The electronic device 100 may further include an insulating layer IL6 disposed on the second semiconductor layer SM2 and covering the second semiconductor layer SM2, but not limited thereto. The insulating layer IL6 may serve as the gate insulating layer of the second transistor TS2. The electronic device 100 may include a third conductive layer M3, wherein the third conductive layer M3 may be disposed on the insulating layer IL6. The third conductive layer M3 may form the gate electrode GE2 of the second transistor TS2. The electronic device 100 may include an insulating layer IL7 disposed on the insulating layer IL6 and covering the third conductive layer M3. The electronic device 100 may include a fourth conductive layer M4 disposed on the insulating layer IL7. The fourth conductive layer M4 may form the source electrode SE2 of the second transistor TS2. In detail, the fourth conductive layer M4 may be filled into a via V2 penetrating the insulating layer IL6 and the insulating layer IL7 and contact the source region SR2 to form the source electrode SE2. The electronic device 100 may include an insulating layer IL8 disposed on the insulating layer IL7 and covering the fourth conductive layer M4. The electronic device 100 may include a fifth conductive layer M5 disposed on the insulating layer IL8. The fifth conductive layer M5 may form the drain electrode DE2 of the second transistor TS2. In detail, the fifth conductive layer M5 may be filled into a via V3 penetrating the insulating layer IL6, the insulating layer IL7 and the insulating layer IL8 and contact the drain region DR2 to form the drain electrode DE2. According to the present embodiment, the second semiconductor layer SM2 may include metal oxides, such as indium gallium zinc oxide (IGZO), but not limited thereto. The third conductive layer M3, the fourth conductive layer M4 and the fifth conductive layer M5 may include any suitable conductive material. For example, the third conductive layer M3 and the fourth conductive layer M4 may include metal materials, and the fifth conductive layer M5 may include transparent conductive materials, but not limited thereto. The insulating layer IL6, the insulating layer IL7 and the insulating layer IL8 may include any suitable insulating material. In the present embodiment, the second transistor TS2 may include a top gate transistor, but not limited thereto. In other embodiments, the second transistor TS2 may include a bottom gate transistor, a dual gate transistor or a transistor of other types.

In some embodiments, the electronic device 100 may include an insulating layer IL5 disposed between the substrate SB and the first insulating layer IL1. The first conductive layer M1 may be disposed on the insulating layer IL5. The insulating layer IL5 may serve as a buffer layer to reduce the possibility of diffusion of impurities in the substrate which affects the characteristics of the transistors during the manufacturing process, and the insulating layer IL5 may include any suitable insulating material. In some embodiments, the electronic device 100 may include an insulating layer IL9 disposed on the insulating layer IL8.

The insulating layer IL9 may include any suitable insulating material, such as organic insulating materials, but not limited thereto. Therefore, the insulating layer IL9 may serve as a planarization layer when it is an organic layer OL to provide a flat surface to facilitate disposing other elements, layers and/or display medium layers (not shown) thereon. In some embodiments, the electronic device 100 may include an electrode EL1 disposed on the insulating layer IL9, an insulating layer IL10 disposed on the insulating layer IL9 and covering the electrode EL1, and an electrode EL2 disposed on the insulating layer IL10. The electrode EL1 and the electrode EL2 may include any suitable conductive material, such as transparent conductive materials, but not limited thereto. The insulating layer IL10 may include any suitable insulating material, such as organic insulating materials, but not limited thereto. The electrode EL1 and the electrode EL2 may serve as pixel electrodes or common electrodes and may be electrically connected to the second transistor TS2. For example, the electrode EL1 may be filled into a via V4 penetrating the insulating layer IL9 and may be electrically connected to the drain electrode DE2 of the second transistor TS2 to form the pixel electrode, but not limited thereto. It should be noted that the elements and/or the layers included in the electronic device 100 is not limited to the above-mentioned contents.

Although it is not shown in FIG. 3, the electronic device 100 may further include a display medium layer (not shown) and an opposite substrate (not shown) disposed on the electrode EL2, wherein the display medium layer may be disposed between the substrate SB and the opposite substrate. The display medium layer may include different elements and/or materials according to the type of the electronic device 100. For example, the electronic device 100 of the present embodiment may include a non-self-emissive display device, and the display medium layer may include liquid crystal, but not limited thereto. In such condition, the electrode EL1 and the electrode EL2 can control the rotation of liquid crystal molecules to display images. In addition, when the electronic device 100 includes non-self-emissive display device, the electronic device 100 may further include a backlight module (not shown) disposed at another side of the substrate SB opposite to the insulating layer IL5. In some embodiments, when the electronic device 100 includes self-emissive display device, the display medium layer may for example include light emitting diodes or other suitable light emitting elements. The opposite substrate may include a substrate and a light converting layer and a black matrix layer disposed thereon, but not limited thereto. The light converting layer may include any suitable material capable of changing the wavelength and/or color of light. The black matrix layer may include any suitable light shielding material. In some embodiments, the light converting layer may be disposed on the substrate SB, but the present disclosure is not limited thereto.

In addition to the above-mentioned elements and/or layers, the electronic device 100 of the present embodiment may include other suitable elements and/or layers according to the demands of design.

The electronic device 100 has a display area DA and a non-display area NDA, wherein the first transistor TS1 may be disposed in the non-display area NDA, and the second transistor TS2 may be disposed in the display area DA, but not limited thereto. The structure of the display area DA shown in FIG. 3 may be the cross sectional structure of the structure shown in FIG. 2 along a sectional line C-C', but not limited thereto. The display area DA may be defined by the data lines DL and scan lines SL in the electronic device 100. Specifically, as shown in FIG. 1, the display area DA may be defined as the region enclosed by two of the data lines DL respectively at two ends and two of the scan lines SL respectively at two ends. For example, the display area DA may be the region enclosed by the scan line SL1, the scan line SLN, the data line DL1 and the data line DLN. The non-display area NDA may be another area of the electronic device 100 except for the display area DA. The display area DA may be the light emitting area or display area of the electronic device 100. The non-display area NDA may be used to dispose peripheral elements of the electronic device 100, such as gate driving circuit GD, multiplexer MU and/or other suitable elements. The scan lines SL may be electrically connected to the gate driving circuits GD, such that the output signals of the scan lines SL can be controlled by the gate driving circuits GD. In other words, the first transistor TS1 including low temperature polycrystalline silicon (the first semiconductor layer SM1) may be disposed in the non-display area NDA, wherein the first transistor TS1 may be included in the peripheral elements (such as the gate drive circuit GD or multiplexer MU) disposed in the non-display area NDA; the second transistor TS2 including metal oxide (the second semiconductor layer SM2) may be disposed in the display area DA, wherein the second transistor TS2 may be used as the driving element of the display medium layer (such as liquid crystal molecules or light emitting elements). In addition, the gate electrode GE2 of the second transistor TS2 may be electrically connected to the scan line SL, and the source electrode SE2 of the second transistor TS2 may be electrically connected to the data line DL, but not limited thereto. In the present embodiment, the second transistor TS2 may be disposed corresponding to the black matrix layer (not shown), thereby reducing the influence of the second transistor TS2 on the display effect of the electronic device 100. It should be noted that in some embodiments, the first transistor TS1 including low temperature polycrystalline silicon may further be disposed in the display area DA. In other words, the first transistor TS1 including low temperature polycrystalline silicon and the second transistor TS2 including metal oxide may be disposed in the display area DA.

According to the present embodiment, as shown in FIG. 3, the electronic device 100 may include a barrier layer BA, wherein the barrier layer BA may be disposed on an insulating layer between the first semiconductor layer SM1 and the second semiconductor layer SM2. For example, the barrier layer BA may be disposed on the second insulating layer IL2, but not limited thereto. In detail, the barrier layer BA may be disposed between the second semiconductor layer SM2 and the second insulating layer IL2. The "insulating layer between the first semiconductor layer SM1 and the second semiconductor layer SM2" mentioned above may indicate the insulating layer(s) above the first semiconductor layer SM1 and under the second semiconductor layer SM2 in the top view direction of the electronic device 100. In some embodiments, when multiple insulating layers are included between the first semiconductor layer SM1 and the second semiconductor layer SM2, the barrier layer BA may be disposed on any one of these insulating layers. The second transistor TS2 is disposed on the barrier layer BA, and the barrier layer BA may be disposed corresponding to the second transistor TS2, or the barrier layer BA may be disposed corresponding to the second semiconductor layer SM2 of the second transistor TS2. In other words, the barrier layer BA may overlap the second semiconductor layer SM2 in the top view direction of the electronic device 100.

According to the present embodiment, the material of the barrier layer BA may include aluminum, titanium, molybdenum, alloys thereof or combinations of the above-mentioned materials. The barrier layer BA may include a single-layer structure or a multi-layer structure. For example, the barrier layer BA of the present embodiment may include the alloy material formed by stacking molybdenum/aluminum/molybdenum or the structure formed by stacking titanium/aluminum/titanium.

According to the present embodiment, the barrier layer BA may be used to block hydrogen ions from diffusing to the second semiconductor layer SM2, thereby reducing the possibility that the characteristics of the second semiconductor layer SM2 is changed due to being affected by hydrogen ions. Specifically, the manufacturing process of the electronic device 100 may include forming the first semiconductor layer SM1 including low temperature polycrystalline silicon at first, and then forming the second transistor TS2 including metal oxide, wherein when the first semiconductor layer is being formed, the defects of low temperature polycrystalline silicon can be compensated by hydrogenation technology. In such condition, when the second semiconductor layer SM2 is being formed, excessive hydrogen ions may be diffused to the second semiconductor layer SM2, such that the second semiconductor layer SM2 including metal oxide would tend to become a conductor, thereby reducing the ability of the second semiconductor layer SM2 as a switch. For example, hydrogen ions may be diffused to the second semiconductor layer SM2 through the insulating layer IL2. Therefore, the performance of the electronic device 100 may be affected. In another aspect, since the electronic device 100 includes the barrier layer BA disposed between the first semiconductor layer SM1 and the second semiconductor layer SM2, wherein the barrier layer BA includes the layer(s) capable of blocking hydrogen ions, the possibility of diffusion of hydrogen ions to the second semiconductor layer SM2 may be reduced. For example, the barrier layer BA may include aluminum, wherein aluminum has a better effect of blocking hydrogen ions. In addition, in order to reduce the possibility of oxidation of aluminum, protecting layers such as molybdenum layer or titanium layer may be disposed at the upper side and lower side of the aluminum layer, but not limited thereto.

In some embodiments, the barrier layer BA may be applied with a fixed potential, for example, the barrier layer BA may be grounded or applied with modulated direct current signal, and the second transistor TS2 shown in FIG. 3 may be a top gate transistor. In some embodiments, the barrier layer BA may be applied with a gate signal (such as an alternating current signal), for example, the barrier layer BA may be electrically connected to the gate electrode GE2 or additional signal lines, and the second transistor TS2 shown in FIG. 3 may be a double gate transistor.

FIG. 2 shows a partial enlarged top view of the display area DA of the electronic device 100. In other words, FIG. 2 shows a top view of the second transistor TS2. It should be noted that in order to simplify the figure, FIG. 2 just exemplary shows the structures of the barrier layer BA and the second transistor TS2, and other elements and/or layers are omitted and can refer to FIG. 3, which will not be redundantly described. In addition, the range of a pixel PX is shown in FIG. 2 as a frame with dotted lines, and the electronic device 100 may include a plurality of pixels PX arranged in an array, but not limited thereto. According to the present embodiment, the size of the barrier layer BA may be adjusted according to the size of the gate electrode GE2 of the second transistor TS2 (or the size of the channel region CH2 of the second transistor TS2). Specifically, as shown in FIG. 2, a distance T1 may be included between the edge E1 of the barrier layer BA and the edge E2 of the gate electrode GE2 adjacent to the edge E1 in a direction, such as the direction Y, wherein the distance T1 may be defined as the distance by which the barrier layer BA protrudes from the gate electrode GE2. The distance T1 may range from 0 micrometer ($\mu$m) to 5 $\mu$m (that is, $0 \leq T1 \leq 5$ $\mu$m), but not limited thereto. The distance T1 may also be defined as the distance by which the barrier layer BA protrudes from the edge of the channel region CH2 of the second semiconductor layer SM2. In some embodiments, the edge E1 of the barrier layer BA may shrink inwardly from the edge E2 of the gate electrode GE2, and a shrinking distance may be included between the edge E1 and the edge E2, wherein the shrinking distance may range from 0 $\mu$m to 1 $\mu$m (that is, $0 \leq$ shrinking distances $\leq 1$ $\mu$m). The above-mentioned range may be used to describe the distance between an edge of the barrier layer BA and an edge of the gate electrode GE2, and the range of the distance between another edge (such as the edge E3) of the barrier layer BA and another edge (such as the edge E4) of the gate electrode GE2 may refer to the above-mentioned contents, which will not be redundantly described. It should be noted that the distance between the edge E1 of the barrier layer BA and the edge E2 of the gate electrode GE2 and the distance between the edge E3 of the barrier layer BA and the edge E4 of the gate electrode GE2 may be the same or different. By making the protruding distance (that is, the distance T1) by which the barrier layer BA protrudes from the gate electrode GE2 (or the channel region CH2 of the second semiconductor layer SM2) ranging from 0 $\mu$m to 5 $\mu$m or making the shrinking distance by which the barrier layer BA shrinks inwardly from the gate electrode GE2 (or the second semiconductor layer SM2) ranging from 0 $\mu$m to 1 $\mu$m, the spatial requirement of the barrier layer BA may be reduced under the condition that the hydrogen ion blocking effect of the barrier layer BA is improved, thereby maintaining the display effect of the electronic device 100.

According to the present embodiment, other insulating layers may be included between the second semiconductor layer SM2 and the barrier layer BA. In detail, a third insulating layer IL3 and a fourth insulating layer IL4 may be included in the electronic device 100, wherein the third insulating layer IL3 may be disposed on the barrier layer BA, and the fourth insulating layer IL4 may be disposed on the third insulating layer IL3. Specifically, the fourth insulating layer IL4 may be disposed between the second semiconductor layer SM2 and the third insulating layer IL3. The upper surface and the lower surface of the fourth insulating layer IL4 may respectively contact the second semiconductor layer SM2 and the third insulating layer IL3, but not limited thereto. The material of the fourth insulating layer IL4 may include any suitable oxide, such as silicon oxide, but not limited thereto. In other words, the material of the insulating layer disposed under and in contact with the second semiconductor layer SM2 may include oxide. By disposing the fourth insulating layer IL4 under the second semiconductor layer SM2, the possibility that the surface of the second semiconductor layer SM2 is hydrogenated may be reduced, thereby improving the performance of the second semiconductor layer SM2. The material of the third insulating layer IL3 may include any suitable nitride, such as silicon nitride, but not limited thereto. By disposing the third insulating layer IL3 between the fourth insulating layer IL4 and the barrier layer BA, the adhesion between the fourth insulating layer IL4 and the barrier layer BA can be improved. In some embodiments, the electronic device 100 may include only one of the third insulating layer IL3 and the fourth insulating layer IL4. It should be noted that other suitable layers and/or elements may further be included between the second semiconductor layer SM2 and the barrier layer BA, which is not limited to the above-mentioned layers.

As shown in FIG. 3, the electronic device 100 may further include a contact CT formed of the fourth conductive layer M4, wherein the contact CT may be electrically connected to the first transistor TS1. Specifically, the contact CT may be filled into a via V5 penetrating the insulating layer IL7, the insulating layer IL6, the insulating layer IL4 and the insulating layer IL3 and contact the source electrode SE1 and the drain electrode DE1 of the first transistor TS1, such that the contact CT is electrically connected to the first transistor TS1. Although it is not shown in FIG. 3, the first transistor TS1 may be electrically connected to external electronic elements through the contact CT.

Figure 4:
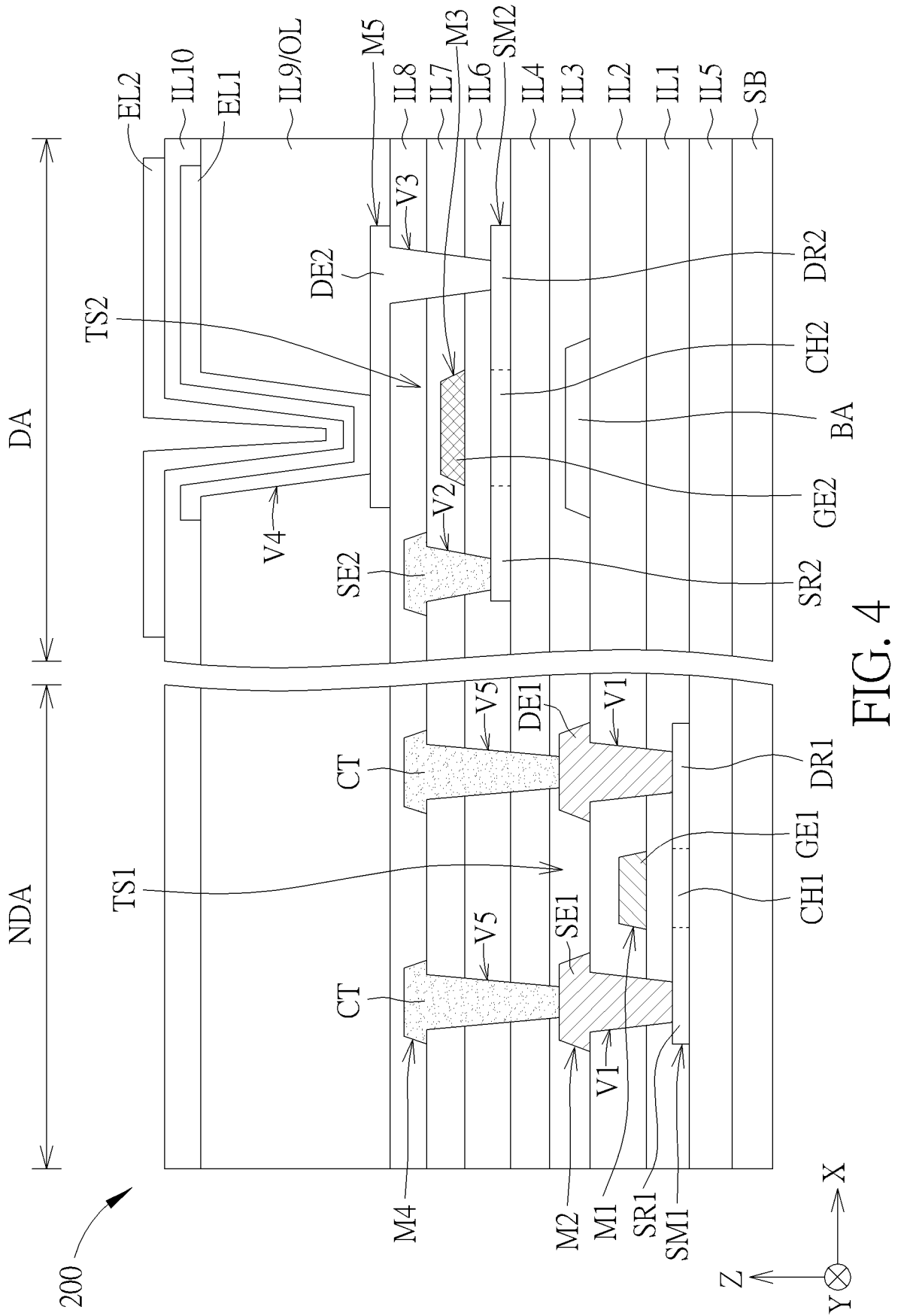
FIG. 4 schematically illustrates a cross sectional view of an electronic device according to a second embodiment of the present disclosure.

Referring to FIG. 4, FIG. 4 schematically illustrates a cross sectional view of an electronic device according to a second embodiment of the present disclosure. One of the main differences between the electronic device 200 of the present embodiment and the electronic device 100 shown in FIG. 3 is that the first transistor TS1 of the electronic device 200 may include a top gate transistor. Specifically, as shown in FIG. 4, the first semiconductor layer SM1 of the first transistor TS1 may be disposed on the insulating layer IL5, and the first conductive layer M1 (or the gate electrode GE1 of the first transistor TS1) may be disposed on the first insulating layer IL1, but not limited thereto. In such condition, the via V1 may penetrate the second insulating layer IL2 and the first insulating layer IL1, and the source electrode SE1 and the drain electrode DE1 may respectively be filled into the via V1 and electrically connected to the source region SR1 and the drain region DR1. The structures of other elements and/or layers of the electronic device 200 may refer to the above-mentioned contents, and will not be redundantly described. In other embodiments, the barrier layer BA may be located at the same layer as the first conductive layer M1, that is, the barrier layer BA is disposed between the first insulating layer IL1 and the second insulating layer IL2.

Figure 5:
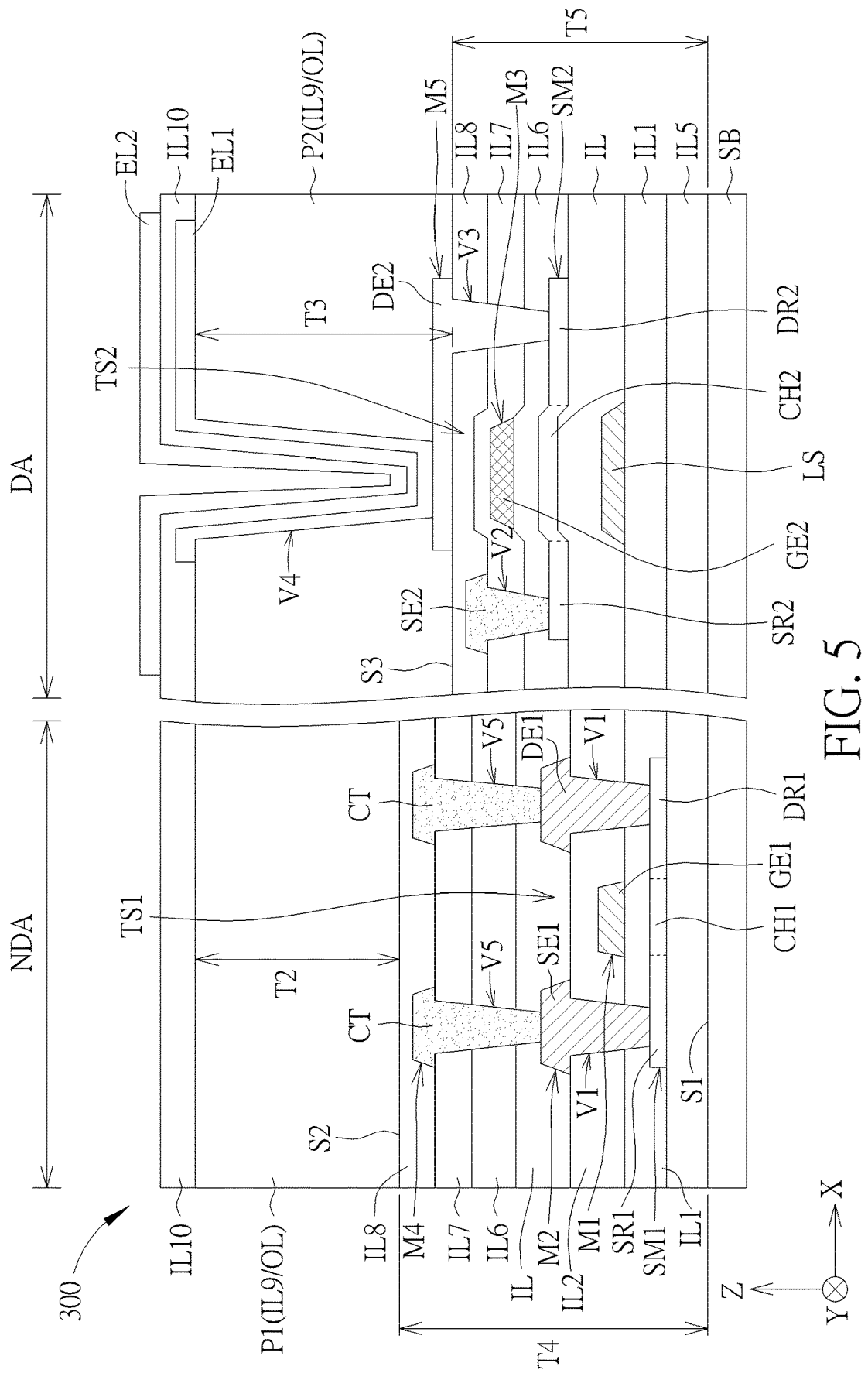
FIG. 5 schematically illustrates a cross sectional view of an electronic device according to a third embodiment of the present disclosure.

Referring FIG. 5, FIG. 5 schematically illustrates a cross sectional view of an electronic device according to a third embodiment of the present disclosure. In order to simplify the figure, the above-mentioned third insulating layer IL3 and/or the fourth insulating layer IL4 are shown as the insulating layer IL in FIG. 5, but not limited thereto. According to the present embodiment, a portion of the insulating layer(s) disposed between the first semiconductor layer SM1 and the second semiconductor layer SM2 of the electronic device 300 in the display area DA may be removed. For example, as shown in FIG. 5, a portion of the second insulating layer IL2 of the electronic device 300 in the display area DA may be removed, such that the second insulating layer IL2 may only be disposed in the non-display area NDA, but not limited thereto. Specifically, after the second insulating layer IL2 is formed, the portion of the second insulating layer IL2 located in the display area DA may be removed at first, and then other elements and/or layers may be formed. By removing the portion of the insulating layer(s) which is between the first semiconductor layer SM1 and the second semiconductor layer SM2 and with greater hydrogen content located in the display area DA, the possibility that hydrogen ions diffuse to the second semiconductor layer SM2 and affect the performance of the second semiconductor layer SM2 may be reduced. It should be noted that the structure shown in FIG. 5 that a portion of the second insulating layer IL2 is removed is exemplary, and the present disclosure is not limited thereto. In some embodiments, a portion of any suitable insulating layer (for example, the insulating layer with greater hydrogen content) in the display area DA may be removed to reduce the possibility that hydrogen ions diffuse to the second semiconductor layer SM2.

As shown in FIG. 5, since the portion of the second insulating layer IL2 of the electronic device 300 in the display area DA may be removed, after a planarization layer (that is, the insulating layer IL9, or the organic layer OL) is disposed on the insulating layer IL8, the thickness of a portion of the planarization layer in the non-display area and the thickness of another portion of the planarization layer in the display area DA may be different. Specifically, the electronic device 300 may include an organic layer OL disposed on the first transistor TS1 and the second transistor TS2, wherein the organic layer OL includes a first portion P1 disposed corresponding to the first transistor TS1 and a second portion P2 disposed corresponding to the second transistor TS2. The first transistor TS1 is disposed in the non-display area NDA, and the second transistor TS2 is disposed in the display area DA. Therefore, the first portion P1 of the organic layer OL may correspond to the non-display area NDA, and the second portion P2 of the organic layer OL may correspond to the display area DA. According to the present embodiment, the first portion P1 of the organic layer OL corresponding to the non-display area NDA may have a thickness T2, and the second portion P2 of the organic layer OL corresponding to the display area DA may have a thickness T3, wherein the thickness T2 may be lower than the thickness T3. The thickness T2 may be defined as the maximum thickness of the first portion P1 of the organic layer OL, and the thickness T3 may be defined as the maximum thickness of the second portion P2 of the organic layer OL, but not limited thereto. In some embodiments, the thickness T2 and the thickness T3 are substantially the same. In some embodiments, a first distance T4 is defined as the minimum distance from the substrate SB to the first portion P1 of the organic layer OL, and a second distance T5 is defined as the minimum distance from the substrate SB to the second portion P2 of the organic layer OL, wherein the first distance T4 may be greater than the second distance T5, but not limited thereto. In the top view direction of the electronic device 300, the first distance T4 may be defined as the distance from the upper surface S1 of the substrate SB to the lower surface S2 of the first portion P1, and the second distance T5 may be defined as the distance from the upper surface S1 of the substrate SB to the lower surface S3 of the second portion P2, but not limited thereto. The structures of the first transistor TS1 and the second transistor TS2 may refer to the above-mentioned contents, and will not be redundantly described. It should be noted that although FIG. 5 shows the structure that the first transistor TS1 and the second transistor TS2 include top gate transistor, the present disclosure is not limited thereto.

As shown in FIG. 5, the electronic device 300 may further include a light shielding layer LS disposed corresponding to the second transistor TS2 (or the second semiconductor layer SM2). In the present embodiment, the light shielding layer LS may be disposed on the first insulating layer IL1 and covered by the insulating layer IL. In other words, the light shielding layer LS may be located under the second semiconductor layer SM2. The light shielding layer LS may reduce the possibility that the characteristics of the second semiconductor layer SM2 are affected by light, thereby improving the performance of the second transistor TS2. That is, the light shielding layer LS may be disposed between the second transistor TS2 and the substrate SB and correspond to the second transistor TS2. In some embodiments, the light shielding layer LS may serve as the above-mentioned barrier layer BA to provide hydrogen ion blocking effect, thereby reducing the possibility that hydrogen ions diffuse to the second semiconductor layer SM2. The light shielding layer LS may include any suitable light shielding material, such as metal materials, but not limited thereto. The insulating layer IL may be disposed between the light shielding layer LS and the second semiconductor layer SM2. The light shielding layer LS may be located at the same layer as the first conductive layer M1 or the second conductive layer M2. For example, as shown in FIG. 5, the light shielding layer LS may be located at the same layer as the first conductive layer M1, or the light shielding layer LS and the first conductive layer M1 may be formed at the same time, and the material of the light shielding layer LS and the material of the first conductive layer M1 may be the same, but not limited thereto. In such condition, the first conductive layer M1 and the light shielding layer LS may be formed on the first insulating layer IL1 at first, and then the second insulating layer IL2 covering the first conductive layer M1 and the light shielding layer LS may be formed, and then the portion of the second insulating layer IL2 located in the display area DA may be removed to expose the light shielding layer LS, but not limited thereto. In some embodiments, the light shielding layer LS may be located at the same layer as the second conductive layer M2, or the light shielding layer LS and the second conductive layer M2 may be formed at the same time, and the material of the light shielding layer LS and the material of the second conductive layer M2 may be the same. In such condition, the second insulating layer IL2 may be formed, and the portion of the second insulating layer IL2 located in the display area DA may be removed at first, and then the second conductive layer M2 and the light shielding layer LS are formed, but not limited thereto. The structures of other elements and/or layers of the electronic device 300 may refer to the above-mentioned contents, and will not be redundantly described.

Figure 6:
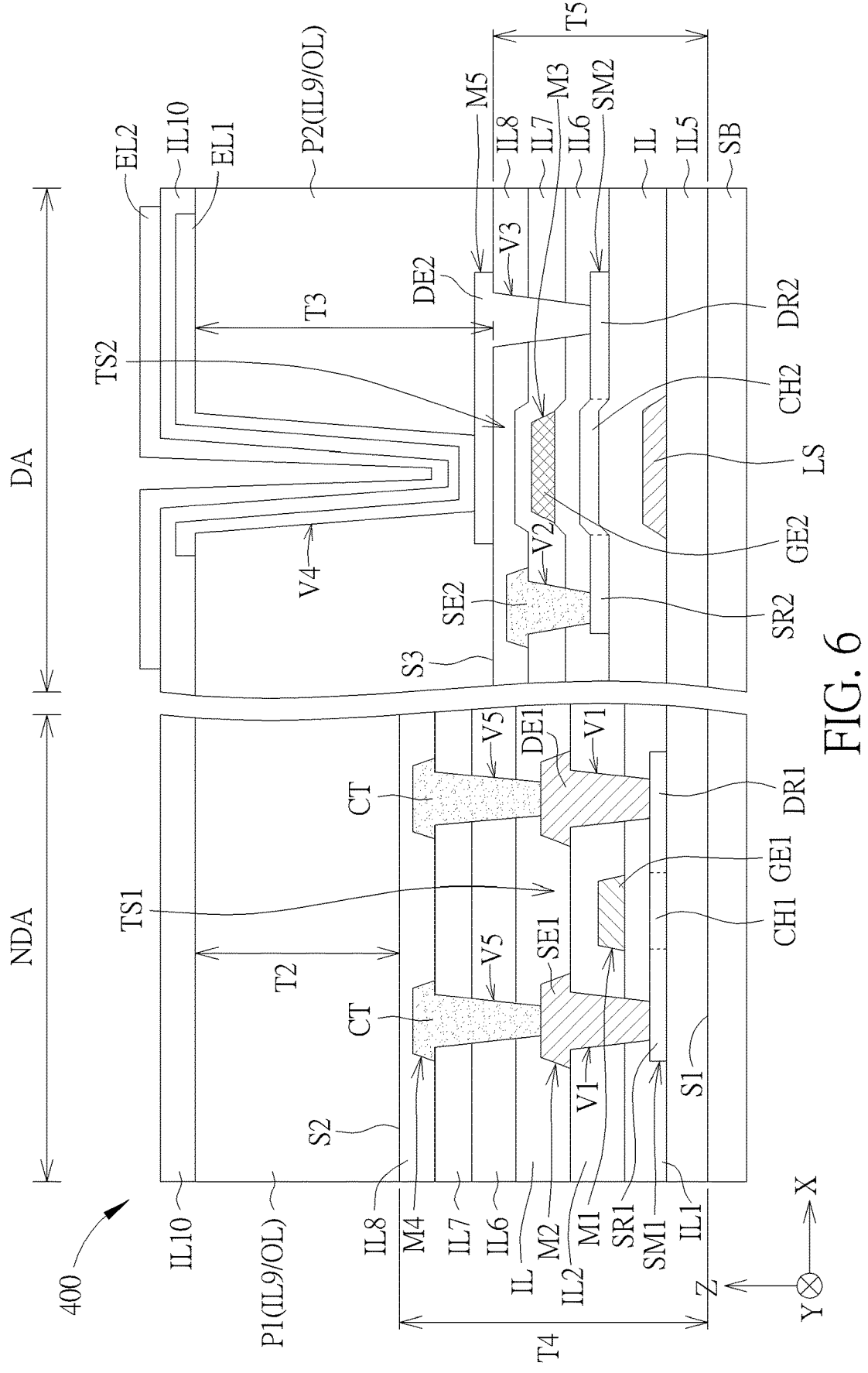
FIG. 6 schematically illustrates a cross sectional view of an electronic device according to a fourth embodiment of the present disclosure.

Referring to FIG. 6, FIG. 6 schematically illustrates a cross sectional view of an electronic device according to a fourth embodiment of the present disclosure. The insulating layer IL shown in FIG. 6 may include the above-mentioned third insulating layer IL3 and/or the fourth insulating layer IL4. One of the main differences between the electronic device 400 of the present embodiment and the electronic device 300 shown in FIG. 5 is the design of the layers in the display area DA. According to the present embodiment, the portions of the first insulating layer IL1 and the second insulating layer IL2 of the electronic device 400 in the display area DA may be removed, such that the first insulating layer IL1 and the second insulating layer IL2 may only be disposed in the non-display area NDA, but not limited thereto. Therefore, the first distance T4 from the substrate SB to the first portion P1 may be greater than the second distance T5 from the substrate SB to the second portion P2. Or, the thickness T2 of the first portion P1 of the organic layer OL corresponding to the non-display area NDA may be lower than the thickness T3 of the second portion P2 of the organic layer OL corresponding to the display area DA. In some embodiments, the thickness T2 and the thickness T3 are substantially the same. By removing the portions of the first insulating layer IL1 and the second insulating layer IL2 in the display area DA, the possibility that hydrogen ions diffuse to the second semiconductor layer SM2 and affects the performance of the second semiconductor layer SM2 may be reduced. In addition, the first transistor TS1 and the second transistor TS2 of the present embodiment may include top gate transistor, but not limited thereto.

In addition, the electronic device 400 may include the light shielding layer LS, wherein the light shielding layer LS may be disposed on the insulating layer IL5 and covered by the insulating layer IL. The insulating layer IL may be disposed between the second semiconductor layer SM2 and the light shielding layer LS. According to the present embodiment, as shown in FIG. 6, the light shielding layer LS may be located at the same layer as the second conductive layer M2, or the light shielding layer LS and the second conductive layer M2 may be formed at the same time, and the material of the light shielding layer LS and the material of the second conductive layer M2 may be the same, but not limited thereto. Specifically, the portions of the first insulating layer IL1 and the second insulating layer IL2 located in the display area DA may be removed at first, and then the second conductive layer M2 and the light shielding layer LS are formed, but not limited thereto. The structures of other elements and/or layers of the electronic device 400 may refer to the above-mentioned contents, and will not be redundantly described.

Figure 7:
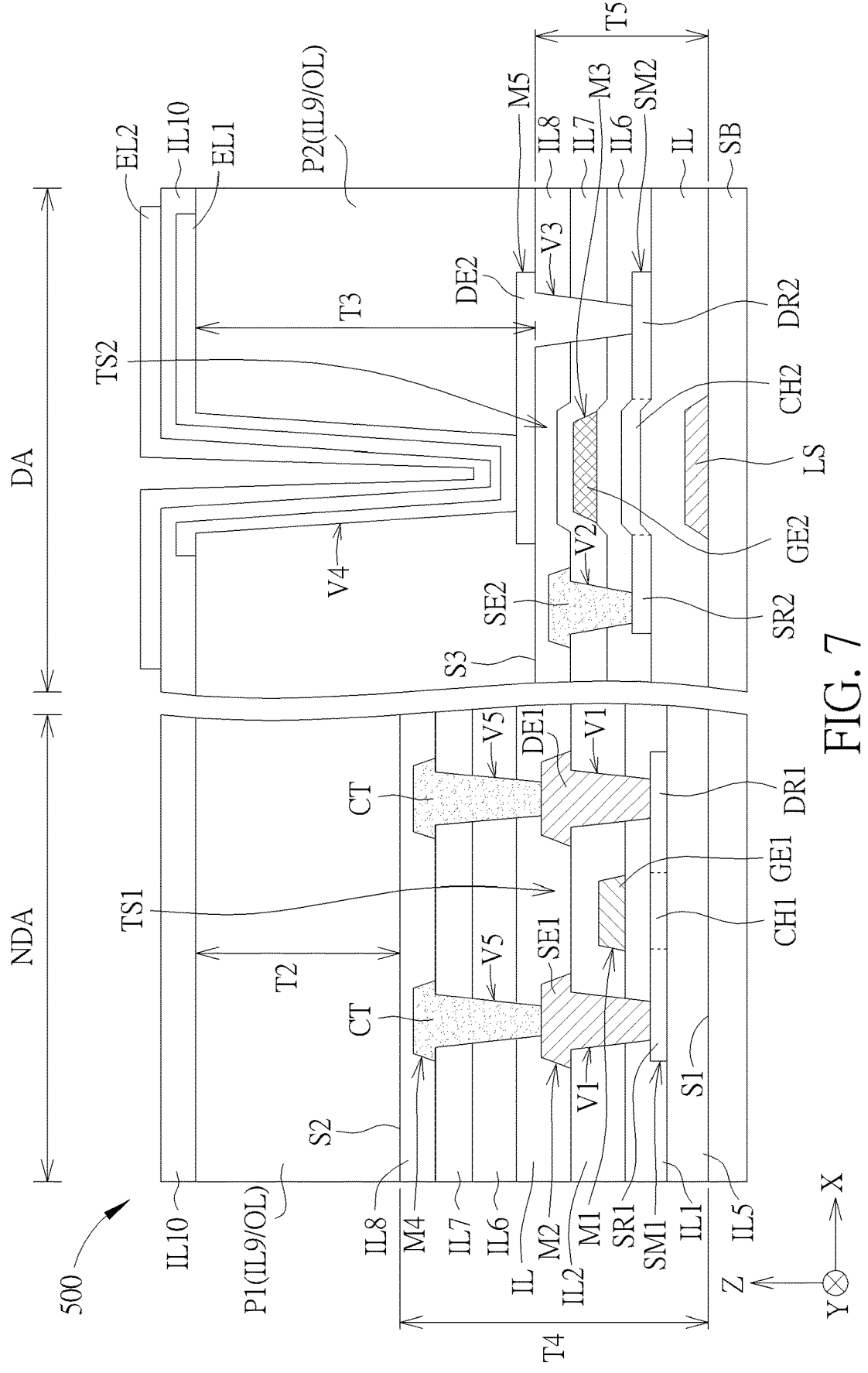
FIG. 7 schematically illustrates a cross sectional view of an electronic device according to a fifth embodiment of the present disclosure.

Referring to FIG. 7, FIG. 7 schematically illustrates a cross sectional view of an electronic device according to a fifth embodiment of the present disclosure. The insulating layer IL shown in FIG. 7 may include the above-mentioned third insulating layer IL3 and/or the fourth insulating layer IL4. One of the main differences between the electronic device 500 of the present embodiment and the electronic device 300 shown in FIG. 5 is the design of the layers in the display area DA. According to the present embodiment, portions of the first insulating layer IL1, the second insulating layer IL2 and the insulating layer IL5 of the electronic device 500 in the display area DA may be removed, such that the first insulating layer IL1, the second insulating layer IL2 and the insulating layer IL5 may only be disposed in the non-display area NDA, but not limited thereto. In some embodiments, a portion of one or two of the first insulating layer IL1, the second insulating layer IL2 and the insulating layer IL5 in the display area DA may be removed. Therefore, the first distance T4 from the substrate SB to the first portion P1 may be greater than the second distance T5 from the substrate SB to the second portion P2. Or, the thickness T2 of the first portion P1 of the organic layer OL corresponding to the non-display area NDA may be lower than the thickness T3 of the second portion P2 of the organic layer OL corresponding to the display area DA. In some embodiments, the thickness T2 and the thickness T3 are substantially the same. By removing the portions of the first insulating layer IL1, the second insulating layer IL2 and the insulating layer IL5 in the display area DA, the possibility that hydrogen ions diffuse to the second semiconductor layer SM2 and affects the performance of the second semiconductor layer SM2 may be reduced. In addition, the first transistor TS1 and the second transistor TS2 of the present embodiment may include top gate transistor, but not limited thereto.

In addition, the electronic device 500 may include the light shielding layer LS, wherein the light shielding layer LS may be disposed on the substrate SB and covered by the insulating layer IL. The insulating layer IL may be disposed between the second semiconductor layer SM2 and the light shielding layer LS. According to the present embodiment, as shown in FIG. 7, the light shielding layer LS may be located at the same layer as the second conductive layer M2, or the light shielding layer LS and the second conductive layer M2 may be formed at the same time, and the material of the light shielding layer LS and the material of the second conductive layer M2 may be the same, but not limited thereto. Specifically, portions of the first insulating layer IL1, the second insulating layer IL2 and the insulating layer IL5 in the display area DA may be removed at first, and then the second conductive layer M2 and the light shielding layer LS may be formed, but not limited thereto. The structures of other elements and/or layers of the electronic device 500 may refer to the above-mentioned contents, and will not be redundantly described.

Figure 8:
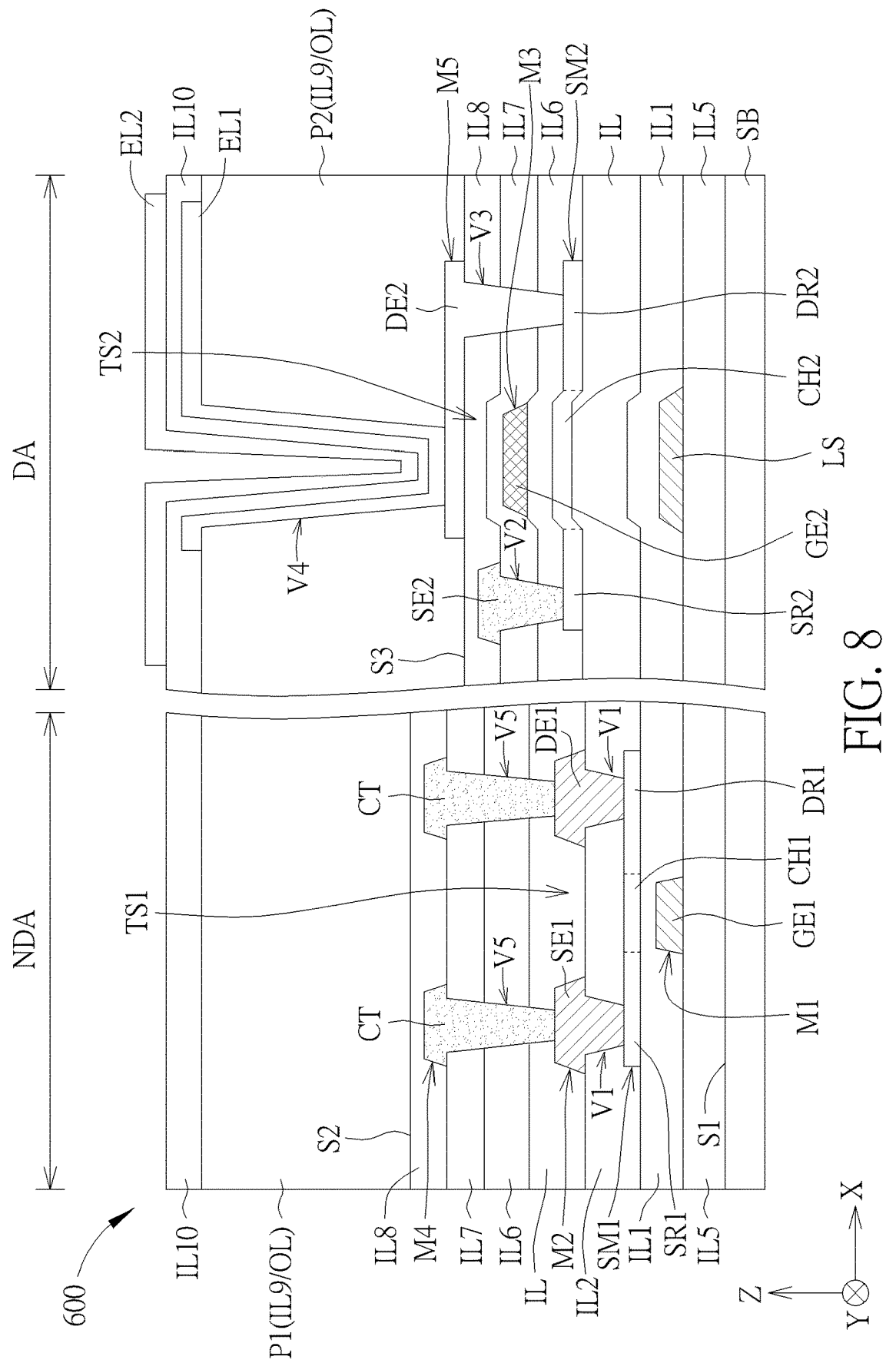
FIG. 8 schematically illustrates a cross sectional view of an electronic device according to a sixth embodiment of the present disclosure.

Referring to FIG. 8, FIG. 8 schematically illustrates a cross sectional view of an electronic device according to a sixth embodiment of the present disclosure. The insulating layer IL shown in FIG. 8 may include the above-mentioned third insulating layer IL3 and/or the fourth insulating layer IL4. One of the main differences between the electronic device 600 shown in FIG. 8 and the electronic device 300 shown in FIG. 5 is the type of the first transistor TS1. According to the present embodiment, as shown in FIG. 8, the first transistor TS1 of the electronic device 600 may include bottom gate transistor, wherein the gate electrode GE1 may be disposed on the insulating layer IL5, the first insulating layer IL1 may be disposed on the gate electrode GE1, and the first semiconductor layer SM1 may be disposed on the first insulating layer IL1. In addition, similar to the electronic device 300, a portion of the second insulating layer IL2 of the electronic device 600 of the present embodiment in the display area DA may be removed, such that the second insulating layer IL2 may only be disposed in the non-display area NDA, but not limited thereto. In such condition, the light shielding layer LS may be at the same layer as the first conductive layer M1 or the second conductive layer M2 in the electronic device 600. For example, as shown in FIG. 8, the light shielding layer LS may be disposed on the insulating layer IL5 and covered by the first insulating layer IL1, wherein the light shielding layer LS may be at the same layer as the first conductive layer M1, or the light shielding layer LS and the first conductive layer M1 may be formed at the same time, and the material of the light shielding layer LS and the material of the first conductive layer M1 may be the same, but not limited thereto. Although it is not shown in FIG. 8, the light shielding layer LS may be disposed on the first insulating layer IL1 and covered by the insulating layer IL in some embodiments, wherein the light shielding layer LS may be at the same layer as the second conductive layer M2, or the light shielding layer LS and the second conductive layer M2 may be formed at the same time, and the material of the light shielding layer LS and the material of the second conductive layer M2 may be the same.

In some embodiments, portions of the first insulating layer IL1 and the second insulating layer IL2 of the electronic device 600 in the display area DA may be removed, such that the first insulating layer IL1 and the second insulating layer IL2 may only be disposed in the non-display area NDA. In such condition, the light shielding layer LS of the electronic device 600 may be at the same layer as the first conductive layer M1 or the second conductive layer M2. In some embodiments, the light shielding layer LS may be disposed on the insulating layer IL5 and covered by the insulating layer IL, wherein the light shielding layer LS may be at the same layer as the first conductive layer M1, or the light shielding layer LS and the first conductive layer M1 may be formed at the same time, and the material of the light shielding layer LS and the material of the first conductive layer M1 may be the same. Specifically, the first conductive layer M1 and the light shielding layer LS may be formed at first, and then the first insulating layer IL1 and the second insulating layer IL2 covering the first conductive layer M1 and the light shielding layer LS may be formed, and then portions of the first insulating layer IL1 and the second insulating layer IL2 in the display area DA may be removed. In some embodiments, the light shielding layer LS may be disposed on the insulating layer IL5 and covered by the insulating layer IL, wherein the light shielding layer LS may be at the same layer as the second conductive layer M2, or the light shielding layer LS and the second conductive layer M2 may be formed at the same time, and the material of the light shielding layer LS and the material of the second conductive layer M2 may be the same. Specifically, the first insulating layer IL1 and the second insulating layer IL2 may be formed at first, and then portions of the first insulating layer IL1 and the second insulating layer IL2 in the display area DA may be removed, and then the second conductive layer M2 and the light shielding layer LS may be formed.

In some embodiments, portions of the first insulating layer IL1, the second insulating layer IL2 and the insulating layer IL5 of the electronic device 600 in the display area DA may be removed, such that the first insulating layer IL1, the second insulating layer IL2 and the insulating layer IL5 may only be disposed in the non-display area NDA. In such condition, the light shielding layer LS may be disposed on the substrate SB and covered by the insulating layer IL, and the light shielding layer LS may be at the same layer as the second conductive layer M2, or the light shielding layer LS and the second conductive layer M2 may be formed at the same time, and the material of the light shielding layer LS and the material of the second conductive layer M2 may be the same. Specifically, portions of the first insulating layer IL1, the second insulating layer IL2 and the insulating layer IL5 in the display area DA may be removed at first, and then the second conductive layer M2 on the second insulating layer IL2 and the light shielding layer LS on the substrate may be formed. In some other embodiments, when the light shielding layer LS and the first conductive layer M1 of the electronic device 600 are at the same layer, a portion of the insulating layer IL5 in the display area DA may be removed at first, and then the first conductive layer M1 and the light shielding layer LS may be formed on the substrate SB, and then portions of the first insulating layer IL1 and the second insulating layer IL2 in the display area DA may be removed, but the present disclosure is not limited thereto.

The structures of other elements and/or layers of the electronic device 600 may refer to the above-mentioned contents, and will not be redundantly described.

Figure 9:
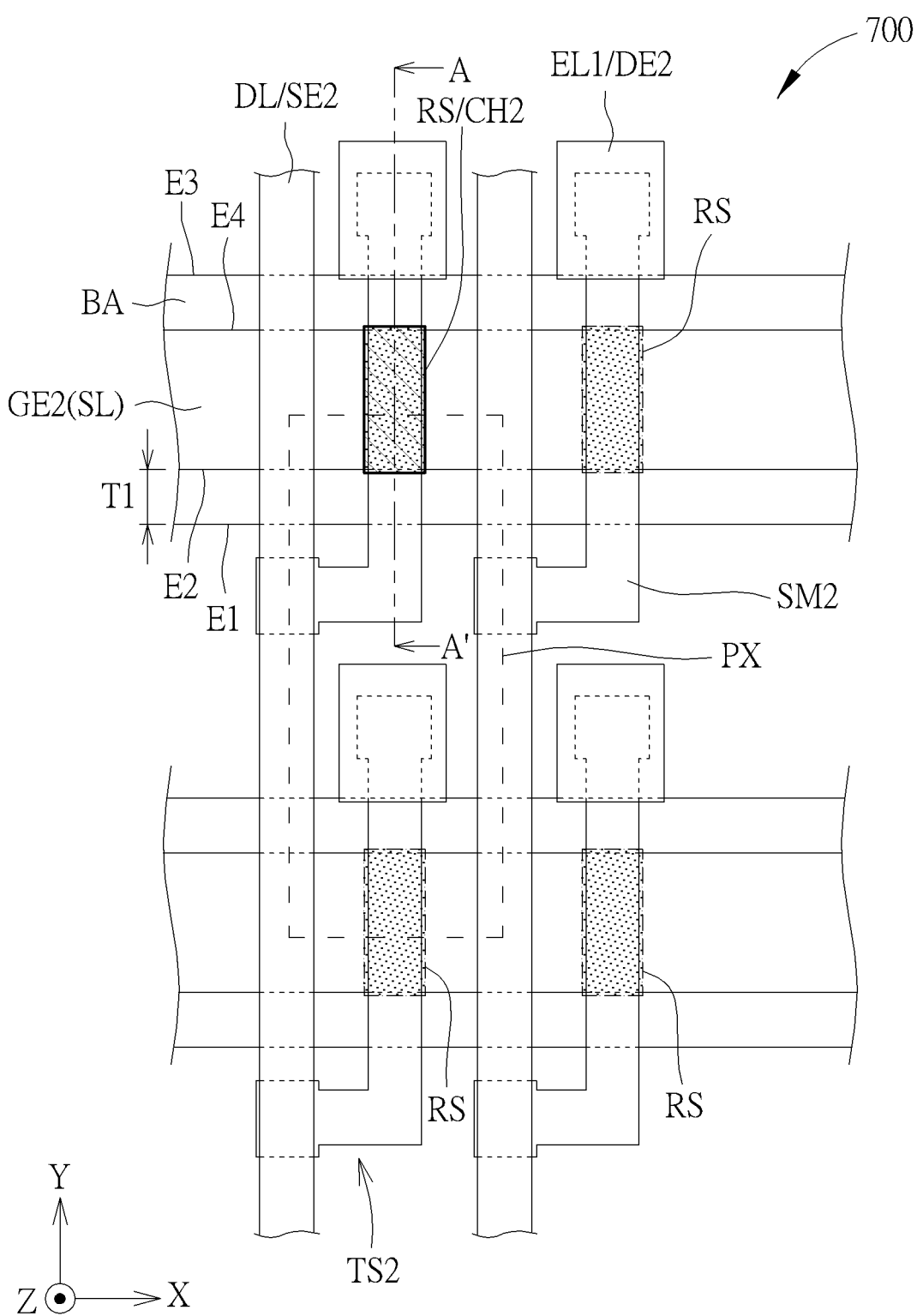
FIG. 9 schematically illustrates a partial enlarged top view of an electronic device according to a seventh embodiment of the present disclosure.
Figure 10:
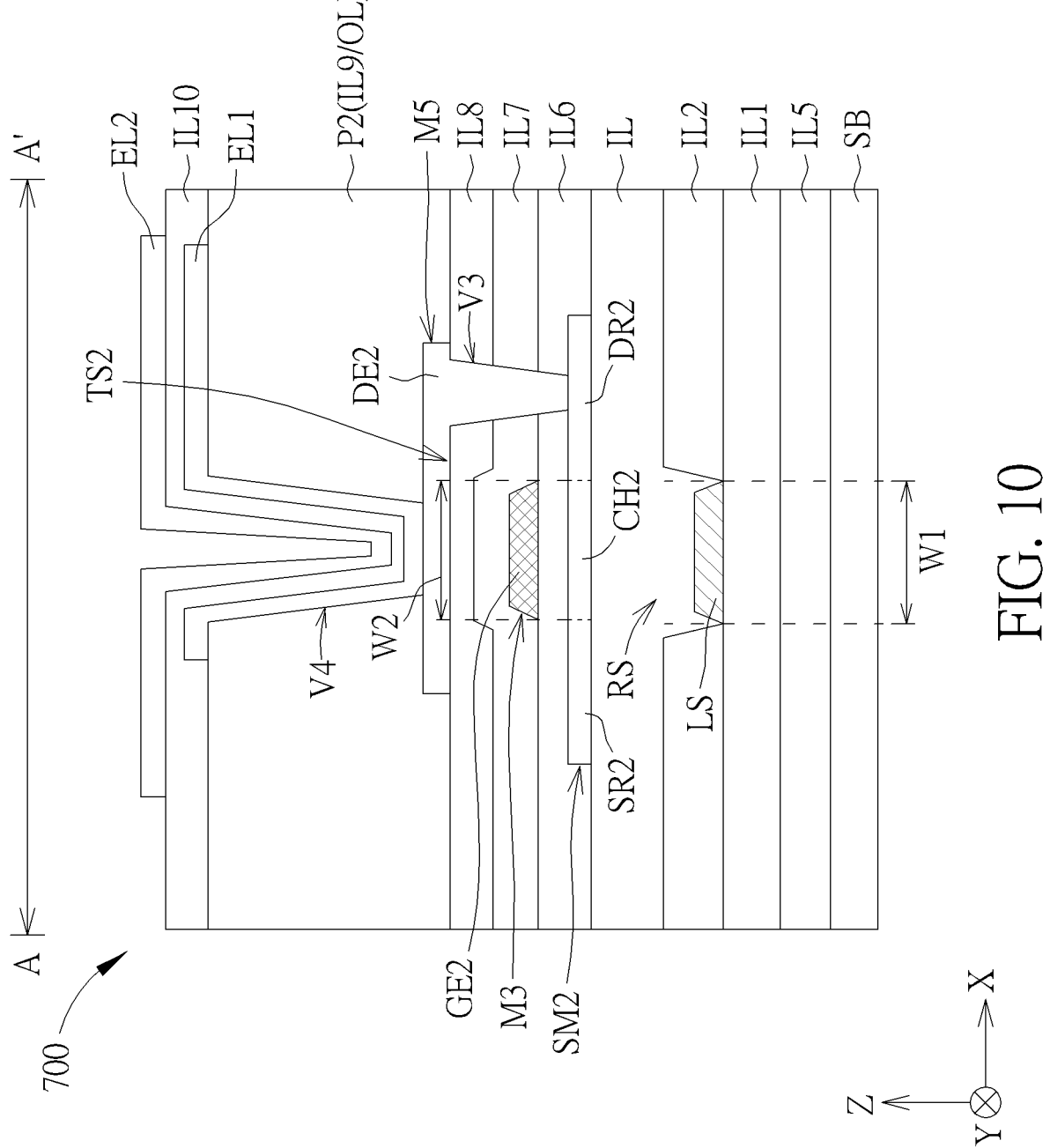
FIG. 10 schematically illustrates a cross sectional view of the electronic device according to the seventh embodiment of the present disclosure.

Referring to FIG. 9 and FIG. 10, FIG. 9 schematically illustrates a partial enlarged top view of an electronic device according to a seventh embodiment of the present disclosure, and FIG. 10 schematically illustrates a cross sectional view of the electronic device according to the seventh embodiment of the present disclosure. Specifically, FIG. 10 shows a cross sectional view of the structure shown in FIG. 9 along a sectional line A-A'. The insulating layer IL shown in FIG. 10 may include the above-mentioned third insulating layer IL3 and/or the fourth insulating layer IL4. It should be noted that FIG. 10 does not show the structure of the portion of the electronic device 700 in the non-display area NDA, and the structure of the portion of the electronic device 700 in the non-display area NDA may refer to the above-mentioned contents, which will not be redundantly described. According to the present embodiment, a portion of the second insulating layer IL2 corresponding to the channel region CH2 of the second semiconductor layer SM2 of the second transistor TS2 may be removed. In other words, a portion of the second insulating layer IL2 corresponding to the gate electrode GE2 may be removed. That is, compared with the electronic device 300 shown in FIG. 5, the second insulating layer IL2 in the display area DA is just partially removed in the electronic device 700 of the present embodiment. Since a portion of the second insulating layer IL2 corresponding to the channel region CH2 may be removed, the second insulating layer IL2 may have a recess RS corresponding to the channel region CH2. In other words, in the top view direction of the electronic device 700, the area for disposing the recess RS may substantially match the area for disposing the channel region CH2 in the top view. The recess RS may expose the first insulating layer IL1, but not limited thereto. By removing a portion of the second insulating layer IL2 corresponding to the channel region CH2, the possibility that hydrogen ions diffuse upward along a vertical direction (that is, the direction Z) to the second semiconductor layer SM2 may be reduced.

According to the present embodiment, since the recess RS may be formed by removing a portion of the second insulating layer IL2 corresponding to the channel region CH2, the size of the recess RS may substantially match the size of the channel region CH2. Specifically, in the top view (for example, FIG. 9) of the electronic device 700, the area of the recess RS may be substantially the same as the area of the channel region CH2. "The area of the recess RS" mentioned above may be the area enclosed by the outline of the bottom of the recess RS, but not limited thereto. In addition, in the cross sectional view (for example, FIG. 10) of the electronic device 700, the width of the recess RS and the width of the channel region CH2 may be substantially the same. "The width of the recess RS" described herein may be the width of the bottom of the recess RS, but not limited thereto. For example, in the cross sectional view shown in FIG. 10, the bottom of the recess RS has a width W1, and the channel region CH2 has a width W2, wherein the width W1 and the width W2 may be substantially the same, but tolerance due to the manufacturing process is allowable, for example, the width W1 of the recess RS may be greater than the width W2 of the channel region CH2. It should be noted that "the cross sectional view of the electronic device 700" mentioned above may be the cross sectional view of the electronic device 700 along any direction which is perpendicular to the plane X-Y, and is not limited to what is shown in FIG. 10. In the following, the definitions of area and width of the recess RS may refer to the above-mentioned contents, and will not be redundantly described.

In addition, the electronic device 700 of the present embodiment may further include the light shielding layer LS, wherein the light shielding layer LS may be disposed in the recess RS. In other words, the light shielding layer LS may be disposed on the first insulating layer IL1, and the insulating layer IL may cover the light shielding layer LS. Specifically, a portion of the second insulating layer IL2 may be removed to form the recess RS at first, and then the light shielding layer LS may be disposed in the recess RS. The size of the light shielding layer LS may substantially match the size of the recess RS, but not limited thereto. For example, in the cross sectional view (for example, FIG. 10) of the electronic device 700, the width of the light shielding layer LS may be substantially the same as the width (that is, the width W1) of the recess RS, but tolerance due to manufacturing process is allowable, for example, the width W1 of the recess RS may be greater than the width of the light shielding layer LS. "The width of the light shielding layer LS" described herein may be the width of the bottom of the light shielding layer LS, but not limited thereto. The light shielding layer LS of the present embodiment may be at the same layer as the first conductive layer M1 or the second conductive layer M2, or the light shielding layer LS and the first conductive layer M1 or the second conductive layer M2 may be formed at the same time, but not limited thereto.

It should be noted that the structure of the electronic device 700 of the present embodiment is not limited to what is shown in FIG. 9 and FIG. 10. In some embodiments, the recess RS may be formed by removing portions of the first insulating layer IL1 and the second insulating layer IL2 corresponding to the channel region CH2, and the light shielding layer LS may be disposed in the recess RS. In some embodiments, the recess RS may be formed by removing portions of the first insulating layer IL1, the second insulating layer IL2 and the insulating layer IL5 corresponding to the channel region CH2, and the light shielding layer LS may be disposed in the recess RS.

Figure 11:
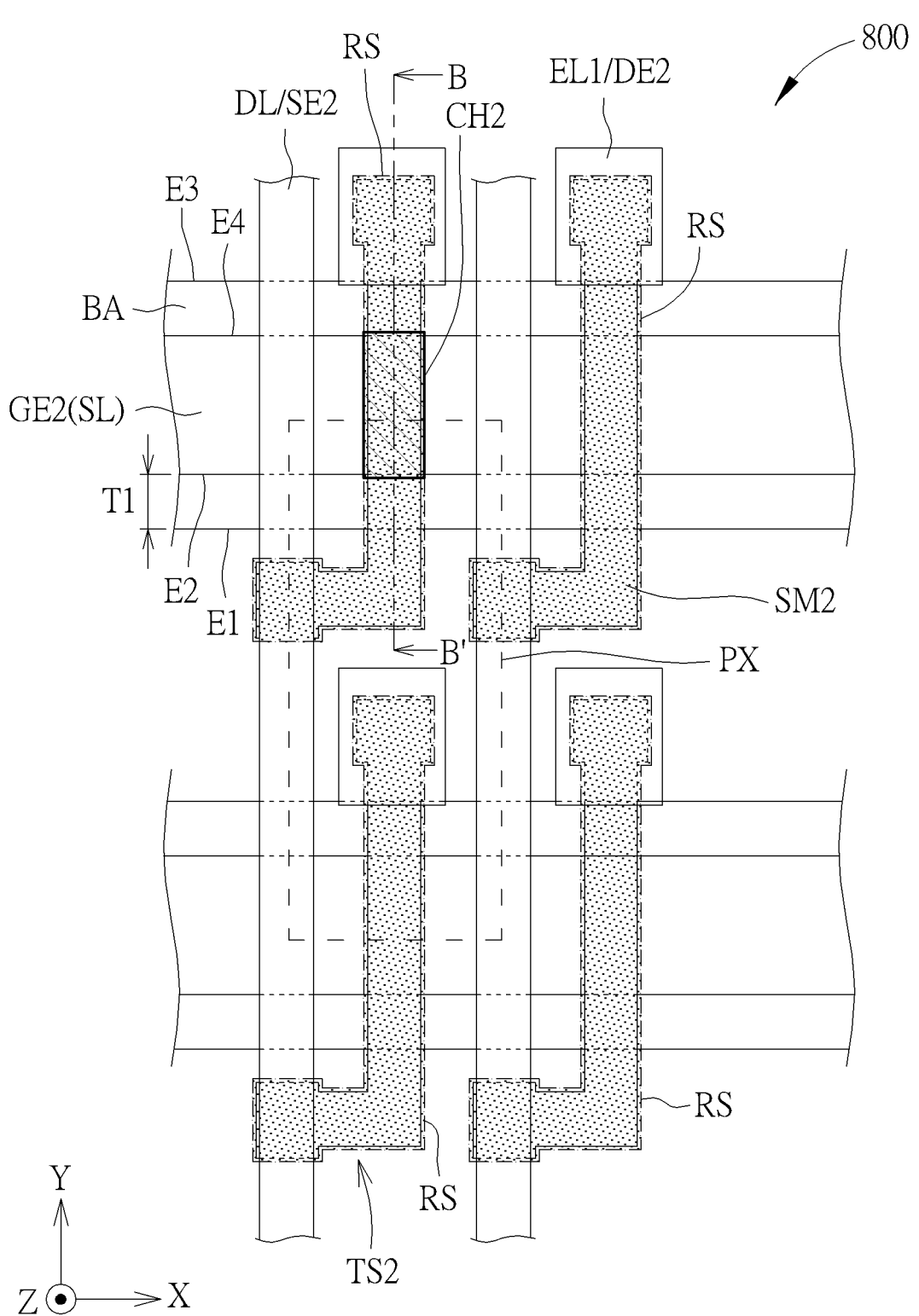
FIG. 11 schematically illustrates a partial enlarged top view of an electronic device according to an eighth embodiment of the present disclosure.
Figure 12:
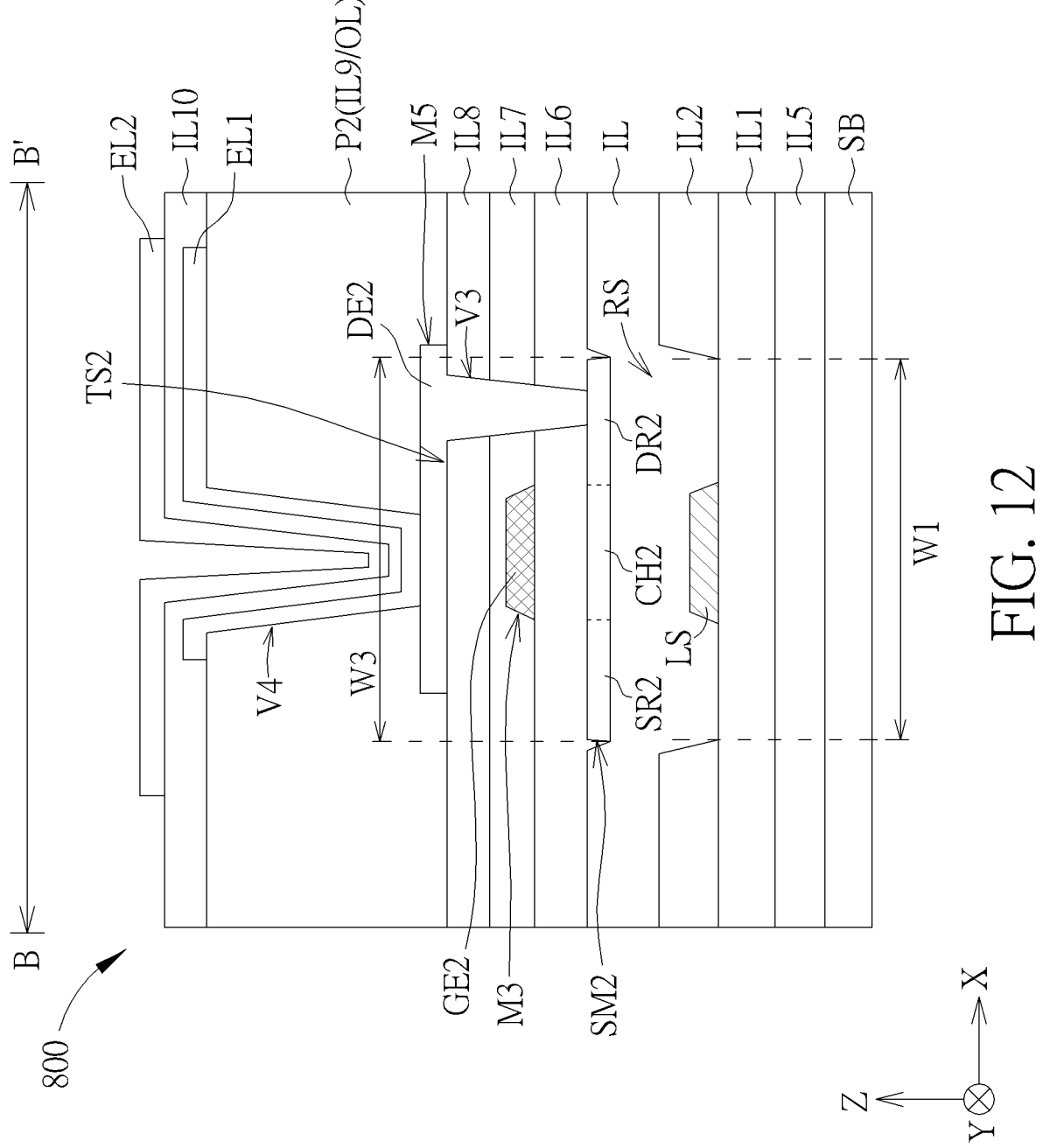
FIG. 12 schematically illustrates a cross sectional view of the electronic device according to the eighth embodiment of the present disclosure.

Referring to FIG. 11 and FIG. 12, FIG. 11 schematically illustrates a partial enlarged top view of an electronic device according to an eighth embodiment of the present disclosure, and FIG. 12 schematically illustrates a cross sectional view of the electronic device according to the eighth embodiment of the present disclosure. Specifically, FIG. 12 shows a cross sectional view of the structure shown in FIG. 11 along a sectional line B-B'. The insulating layer IL shown in FIG. 12 may include the above-mentioned third insulating layer IL3 and/or the fourth insulating layer IL4. It should be noted that FIG. 12 does not show the structure of the portion of the electronic device 800 in the non-display area NDA, and the structure of the portion of the electronic device 800 in the non-display area NDA may refer to the above-mentioned contents, which will not be redundantly described. According to the present embodiment, a portion of the second insulating layer IL2 corresponding to the second semiconductor layer SM2 of the second transistor TS2 may be removed, and a recess RS corresponding to the second semiconductor layer SM2 may be formed in the second insulating layer IL2. In other words, in the top view direction of the electronic device 800, the area for disposing the recess RS may substantially match the area for disposing the second semiconductor layer SM2. By removing a portion of the second insulating layer IL2 corresponding to the second semiconductor layer SM2, the possibility that hydrogen ions diffuse upward along a vertical direction to the second semiconductor layer SM2 may be reduced. In addition, as shown in FIG. 12, since a portion of the second insulating layer IL2 corresponding to the second semiconductor layer SM2 may be removed, the second semiconductor layer SM2 may be surrounded by the insulating layer IL, or the height of the second semiconductor layer SM2 is not greater than the height of the insulating layer IL in a horizontal direction. Therefore, the possibility that hydrogen ions diffuse from peripheries of the second semiconductor layer SM2 to the second semiconductor layer SM2 may be reduced.

Since the recess RS may be formed by removing a portion of the second insulating layer IL2 corresponding to the second semiconductor layer SM2, the size of the recess RS may substantially match the size of the second semiconductor layer SM2. Specifically, in the top view (for example, FIG. 11) of the electronic device 800, the area of the recess RS may be substantially the same as the area of the second semiconductor layer SM2. In addition, in the cross sectional view (for example, FIG. 12) of the electronic device 800, the width of the recess RS and the width of the second semiconductor layer SM2 may be substantially the same. For example, in the cross sectional view shown in FIG. 12, the bottom of the recess RS has a width W1, and the second semiconductor layer SM2 has a width W3, wherein the width W1 and the width W3 may be substantially the same, but tolerance due to manufacturing process is allowable, for example, the width W1 of the recess RS may be greater than the width W3 of the second semiconductor layer SM2. It should be noted that "the cross sectional view of the electronic device 800" mentioned above may be the cross sectional view of the electronic device 800 along any direction which is perpendicular to the plane X-Y, and is not limited to what is shown in FIG. 12. In addition, the electronic device 800 may further include the light shielding layer LS, wherein the light shielding layer LS may be disposed in the recess RS and covered by the insulating layer IL, but not limited thereto. The light shielding layer LS of the present embodiment may be at the same layer as the first conductive layer M1 or the second conductive layer M2, or the light shielding layer LS and the first conductive layer M1 or the second conductive layer M2 may be formed at the same time, but not limited thereto.

It should be noted that the structure of the electronic device 800 of the present embodiment is not limited to what is shown in FIG. 11 and FIG. 12. In some embodiments, the recess RS may be formed by removing portions of the first insulating layer IL1 and the second insulating layer IL2 corresponding to the second semiconductor layer SM2, and the light shielding layer LS may be disposed in the recess RS. In some embodiments, the recess RS may be formed by removing portions of the first insulating layer IL1, the second insulating layer IL2 and the insulating layer IL5 corresponding to the second semiconductor layer SM2, and the light shielding layer LS may be disposed in the recess RS.

Figure 13:
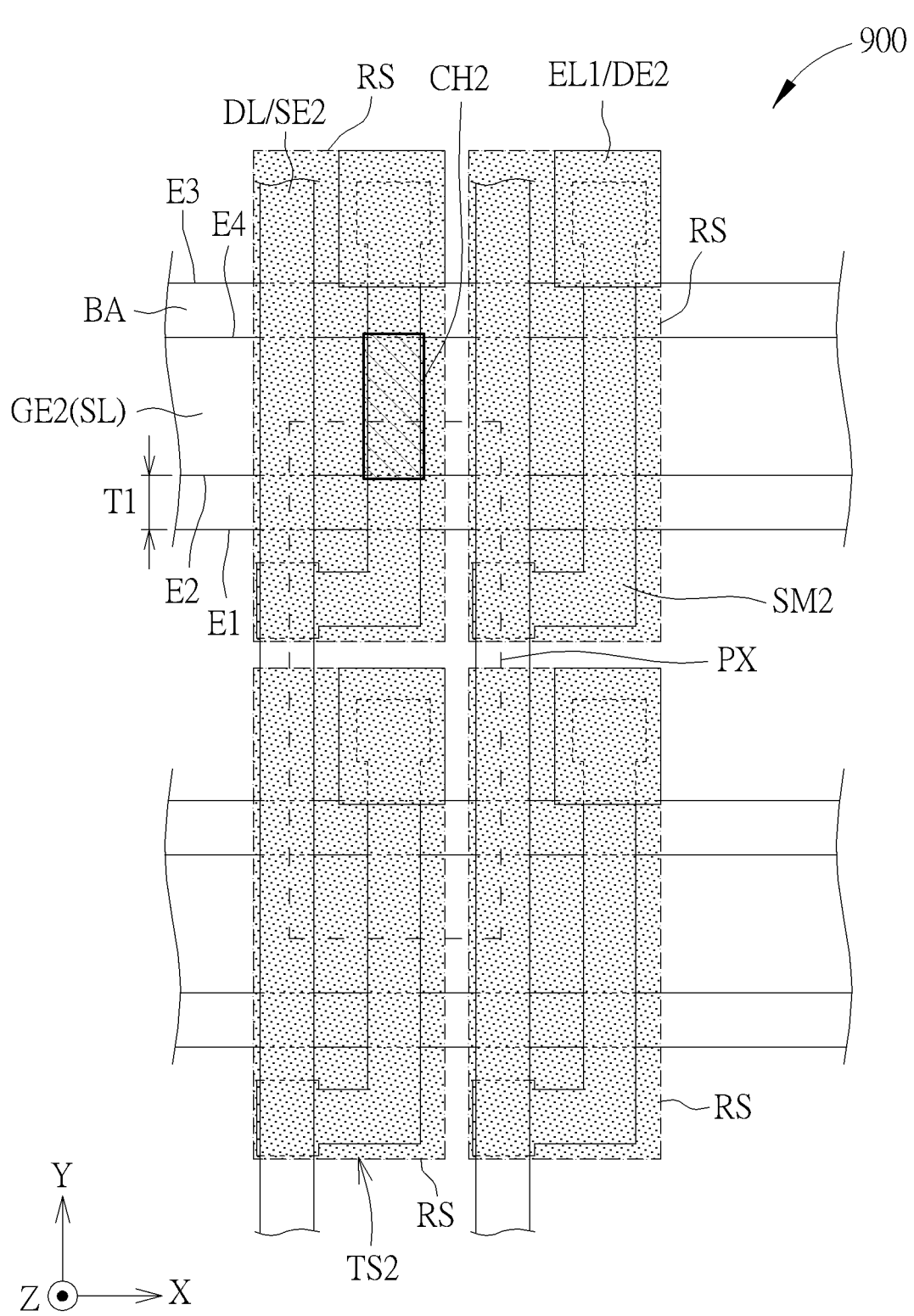
FIG. 13 schematically illustrates a partial enlarged top view of an electronic device according to a ninth embodiment of the present disclosure.

Referring to FIG. 13, FIG. 13 schematically illustrates a partial enlarged top view of an electronic device according to a ninth embodiment of the present disclosure. Specifically, FIG. 13 shows a partial enlarged top view of the display area DA of the electronic device 900. According to the present embodiment, the recess RS may be formed by removing a portion of specific insulating layer(s) (for example, the insulating layers with greater hydrogen content) of the electronic device 900 corresponding to the second transistor TS2. In other words, in the top view direction of the electronic device 900, the area for disposing the recess RS may substantially match the area for disposing the second transistor TS2. In some embodiments, the recess RS may be formed by removing a portion of the second insulating layer IL2 corresponding to the second transistor TS2. In some embodiments, the recess RS may be formed by removing portions of the first insulating layer IL1 and the second insulating layer IL2 corresponding to the second transistor TS2. In some embodiments, the recess RS may be formed by removing portions of the first insulating layer IL1, the second insulating layer IL2 and the insulating layer IL5 corresponding to the second transistor TS2. In the present embodiment, the area of the second transistor TS2 may be defined through the second semiconductor layer SM2, the gate electrode GE2, the source electrode SE2 and the drain electrode DE2. Specifically, the area of the second transistor TS2 may be defined as the minimum rectangle enclosed by the outlines of the second semiconductor layer SM2, the gate electrode GE2, the source electrode SE2 and the drain electrode DE2, but not limited thereto. Therefore, the area for disposing the recess RS may correspond to the minimum rectangle mentioned above, as shown in FIG. 13, but not limited thereto. The area of the first transistor TS1 may be defined in the same way mentioned above. By removing a portion of specific insulating layer(s) of the electronic device 900 corresponding to the second transistor TS2, the possibility that hydrogen ions diffuse upward along a vertical direction to the second semiconductor layer SM2 may be reduced. In addition, since a portion of the second insulating layer IL2 corresponding to the second transistor TS2 may be removed, the second semiconductor layer SM2 may be surrounded by the insulating layer IL. Therefore, the possibility that hydrogen ions diffuse from peripheries of the second semiconductor layer SM2 to the second semiconductor layer SM2 may be reduced. The electronic device 900 may further include the light shielding layer (such as the light shielding layer LS mentioned above), wherein the light shielding layer may be disposed in the recess RS, but not limited thereto.

Return to FIG. 1, the electronic device 100 may further include dummy sub-pixels DUM located outside the display area DA, wherein the dummy sub-pixels DUM may surround the display area DA, but not limited thereto. For example, as shown in FIG. 1, one to nine dummy sub-pixels DUM may be disposed outside each side of the display area DA, wherein the dummy sub-pixels DUM may be arranged in an array, but not limited thereto. The numbers of the dummy sub-pixels DUM outside different sides of the display area DA may be different. In the present embodiment, the dummy sub-pixel DUM may be the sub-pixel in the electronic device 100 that is not used for displaying image or receiving electrical signal and/or the pixel electrode thereof is not connected to the driving element (or the drain electrode of the driving element), but not limited thereto. In some embodiments, a portion of specific insulating layer(s) of the electronic device 100 (for example, the insulating layer with greater hydrogen content, but not limited thereto) corresponding to the display area DA and the area for disposing the dummy sub-pixels DUM may be removed. For example, portions of the first insulating layer IL1, the second insulating layer IL2 and/or the insulating layer IL5 corresponding to the display area DA and the area for disposing the dummy sub-pixels DUM may be removed. The area for disposing the dummy sub-pixels DUM may for example be defined as the region enclosed by the outer edge of the outermost dummy sub-pixels DUM, but not limited thereto.

Figure 14:
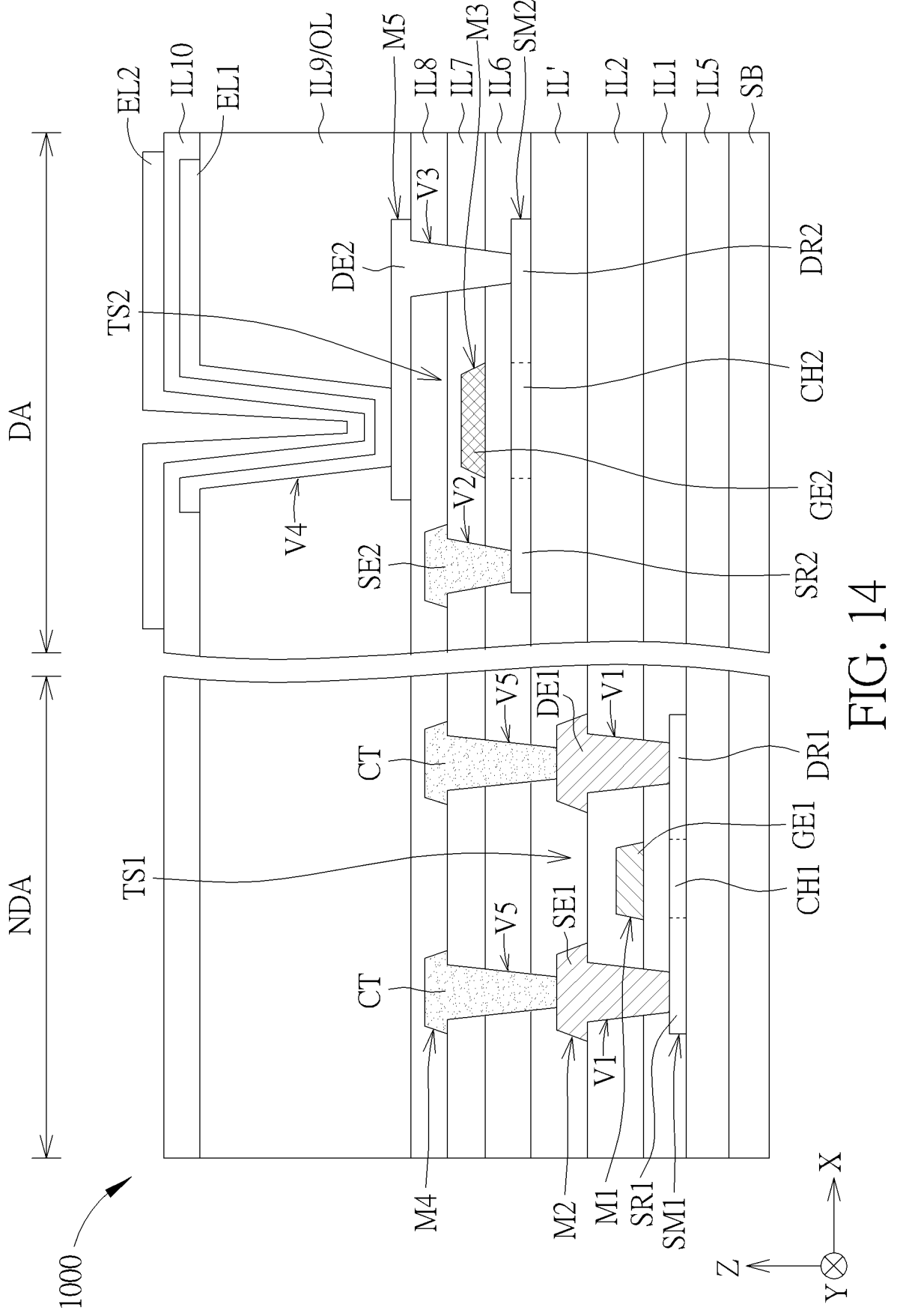
FIG. 14 schematically illustrates a cross sectional view of the electronic device according to a tenth embodiment of the present disclosure.

Referring to FIG. 14, FIG. 14 schematically illustrates a cross sectional view of the electronic device according to a tenth embodiment of the present disclosure. According to the present embodiment, the electronic device 1000 may not include the barrier layer BA, and an insulating layer IL' may be disposed between the first semiconductor layer SM1 and the second semiconductor layer SM2. Specifically, the insulating layer IL' may be disposed on the second insulating layer IL2 and contact the second semiconductor layer SM2, but not limited thereto.

According to the present embodiment, the insulating layer IL' may include oxides with low hydrogen content and film compactness during the manufacturing process thereof, such as silicon oxide ($SiO_x$), aluminum oxide ($AlO_x$), hafnium oxide ($HfO_x$), yttrium oxide ($YO_x$) or other suitable oxides. Since the insulating layer IL' may contact the second semiconductor layer SM2, the possibility that hydrogen ions diffuse to the second semiconductor layer SM2 may be reduced by making the insulating layer IL' including the above-mentioned materials. It should be noted that although the insulating layer IL' is shown as a single layer in FIG. 14, the present disclosure is not limited thereto. In some embodiments, the insulating layer IL' may include a double-layer structure or a multi-layer structure formed of the above-mentioned materials, for example, the insulating layer IL' may be a double-layer structure formed by stacking silicon oxide and aluminum oxide, but not limited thereto. In some embodiments, the electronic device 1000 may further include an insulating layer disposed between the second insulating layer IL2 and the insulating layer IL', wherein the insulating layer may include silicon nitride, but not limited thereto. In some other embodiments, the electronic device 1000 may further include the light shielding layer LS, wherein the light shielding layer LS is disposed corresponding to the second transistor TS2 (or the second semiconductor layer SM2). The features of the light shielding layer LS may refer to the contents in the above-mentioned embodiments, and will not be redundantly described.

In summary, an electronic device is provided by the present disclosure. The electronic device includes a barrier layer disposed between the first semiconductor layer and the second semiconductor layer. The barrier layer can reduce the possibility that hydrogen ions diffuse to the second semiconductor layer, thereby improving reliability of the electronic device. Or, a portion of specific insulating layer of the electronic device with greater hydrogen content may be removed, such that the possibility that hydrogen ions diffuse along a vertical direction to the second semiconductor layer may be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:

a substrate;

a first transistor disposed on the substrate, wherein the first transistor comprises a first semiconductor layer and a gate electrode;

a first insulating layer disposed between the first semiconductor layer and the gate electrode;

a second insulating layer disposed on the first insulating layer, wherein the first semiconductor layer and the gate electrode are located between the substrate and the second insulating layer;

a barrier layer disposed on the second insulating layer; and a second transistor disposed on the barrier layer and comprising a second semiconductor layer, wherein the barrier layer is disposed between the second semiconductor layer and the second insulating layer, wherein the second transistor further comprises another gate electrode, an edge of the barrier layer shrinks inwardly from an edge of the another gate electrode adjacent to the edge of the barrier layer by a distance in a range from 0 micrometer to 1 micrometer.

2. The electronic device of claim 1, wherein a material of the barrier layer comprises aluminum, titanium, molybdenum, alloys thereof or a combination of the above-mentioned materials.

3. The electronic device of claim 1, wherein the barrier layer comprises a multi-layer structure.

4. The electronic device of claim 1, wherein the barrier layer is overlapped with the second semiconductor layer in a top view of the electronic device.

5. The electronic device of claim 1, further comprising a third insulating layer disposed on the barrier layer, wherein a material of the third insulating layer comprises nitride.

6. The electronic device of claim 5, further comprising a fourth insulating layer disposed between the second semiconductor layer and the third insulating layer, wherein a material of the fourth insulating layer comprises oxide.

7. The electronic device of claim 1, wherein the first transistor is disposed in a non-display area of the electronic device, and the second transistor is disposed in a display area of the electronic device.

8. The electronic device of claim 7, further comprising a gate driving circuit and a multiplexer disposed in the non-display area.

9. The electronic device of claim 7, wherein the first semiconductor layer comprises low temperature polycrystalline silicon, and the second semiconductor layer comprises metal oxides.

10. The electronic device of claim 7, further comprising a plurality of dummy sub-pixels surrounding the display area.

11. An electronic device having a display area and a non-display area, comprising:

a substrate;

a first transistor disposed on the substrate, wherein the first transistor is disposed in the non-display area;

a second transistor disposed on the substrate, wherein the second transistor is disposed in the display area; and an organic layer disposed on the first transistor and the second transistor, wherein the organic layer comprises a first portion and a second portion, the first portion is disposed corresponding to the first transistor, and the second portion is disposed corresponding to the second transistor, wherein a minimum distance from the substrate to the first portion is defined as a first distance, a minimum distance from the substrate to the second portion is defined as a second distance, and the first distance is greater than the second distance.

12. The electronic device of claim 11, wherein the first transistor comprises a first semiconductor layer, the second transistor comprises a second semiconductor layer, a material of the first semiconductor layer comprises low temperature polycrystalline silicon, and a material of the second semiconductor layer comprises metal oxide.

13. The electronic device of claim 11, wherein a thickness of the first portion is lower than a thickness of the second portion.

14. The electronic device of claim 11, wherein a thickness of the first portion is equal to a thickness of the second portion.

15. The electronic device of claim 11, further comprising a plurality of dummy sub-pixels surrounding the display area.

16. The electronic device of claim 11, further comprising a light shielding layer disposed corresponding to the second transistor and located between the second transistor and the substrate.

17. The electronic device of claim 16, wherein the light shielding layer comprises metal material.

* * * * *